(12) United States Patent
Akgun et al.

(10) Patent No.: US 8,193,809 B2
(45) Date of Patent: Jun. 5, 2012

(54) THREE DIMENSIONAL RF COIL STRUCTURES FOR FIELD PROFILING

(75) Inventors: Can E. Akgun, Woodbury, MN (US); Carl Snyder, Minneapolis, MN (US); Lance DelaBarre, St. Anthony, MN (US); Steen Moeller, Minneapolis, MN (US); Pierre-Francois Van de Moortele, Minneapolis, MN (US); John Thomas Vaughan, Stillwater, MN (US); Kamil Ugurbil, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 222 days.

(21) Appl. No.: 12/151,053

(22) Filed: May 2, 2008

(65) Prior Publication Data

US 2009/0115417 A1 May 7, 2009

Related U.S. Application Data

(60) Provisional application No. 60/927,352, filed on May 3, 2007.

(51) Int. Cl.
*G01V 3/00* (2006.01)
(52) U.S. Cl. ........................................ 324/318
(58) Field of Classification Search ........... 324/300–322
See application file for complete search history.

(56) References Cited

U.S. PATENT DOCUMENTS

| 4,439,733 | A | * | 3/1984 | Hinshaw et al. | 324/322 |
|---|---|---|---|---|---|
| 4,751,464 | A | * | 6/1988 | Bridges | 324/318 |
| 5,070,241 | A | * | 12/1991 | Jack | 250/336.2 |
| 5,073,755 | A | * | 12/1991 | Neufeld | 324/632 |
| 6,118,274 | A | * | 9/2000 | Roffmann et al. | 324/321 |
| 6,483,415 | B1 | * | 11/2002 | Tang | 336/200 |
| 6,958,607 | B2 | * | 10/2005 | Vaughan et al. | 324/318 |
| 7,088,104 | B2 | * | 8/2006 | Bottomley | 324/328 |
| 7,215,120 | B2 | * | 5/2007 | Vaughan | 324/318 |
| 7,345,483 | B2 | * | 3/2008 | Vaughan | 324/318 |
| 7,375,527 | B2 | * | 5/2008 | Vaughan, Jr. | 324/318 |
| 7,659,719 | B2 | * | 2/2010 | Vaughan et al. | 324/318 |
| 2004/0155656 | A1 | | 8/2004 | Leussler | |
| 2006/0250125 | A1 | | 11/2006 | Bogdanov et al. | |

FOREIGN PATENT DOCUMENTS

JP 2001145610 5/2001

(Continued)

OTHER PUBLICATIONS

Akgun CE et al:"A novel rf head coil for 7T homogeneity and parallel imaging applications", Proceedings of the International Society for Magnetic Resonance in Medicine, ESMRMB-ISMR Joint Annual Meeting, Berlin, German, May 19-25, 2007, p. 1031.

(Continued)

*Primary Examiner* — Dixomara Vargas
(74) *Attorney, Agent, or Firm* — Seager, Tufte & Wickhem LLC

(57) ABSTRACT

In one illustrative embodiment, a radio frequency (RF) coil is disclosed. The RF coil may include a plurality of transmission line elements, wherein at least one of the plurality of transmission line elements may have at least one dimension different than a dimension of another one of the plurality of transmission line elements. In some cases, each of the transmission line elements may include a signal line conductor and a ground plane conductor separated by a dielectric.

3 Claims, 30 Drawing Sheets

FOREIGN PATENT DOCUMENTS

| | | |
|---|---|---|
| WO | 2005111645 A2 | 11/2005 |
| WO | 2005111646 A1 | 11/2005 |
| WO | 2007103953 A2 | 9/2007 |
| WO | 2008064366 A1 | 5/2008 |

OTHER PUBLICATIONS

Kumar et al: "Optimizing the SNR performance of the tunable strip detector", Proceedings of the International Society for Magnetic Resonance in Medicine, 14th Scientific Meeting and Exhibition, May 6-12, 2006, Seattle, WA, p. 2620.

Adriany et al.: "A 32 channel lattice transmission line array for parallel MRI", International Society for Magnetic Resonance in Medicine, Scientifc Meeting and Exhibition Proceedings, Berkeley, CA, vol. 14, May 1, 2006, p. 126.

Zhang et al: "A microstrip transmission line volume coil for human head MR imaging at 4T", Journal of Magnetic Resonance, Academic Press, Orlando, FL, vol. 161, No. 2, Apr. 1, 2003, pp. 242-251.

Vaughan et al.: "RF image optimization at 7T and 9.4T", International Society for Magnetic Resonance in Medicine, Scienetific Meeting and Exhibition Proceedings, Berkeley, Cal, vol. 13, May 1, 2005, p. 953.

Akgun C. et al.: "Microstrip TEM coil optimization at 7T", International Society for Magnetic Resonance in Medicine, Scientific Meeting and Exhibition Proceedings, Berkely, Cal, vol. 14, May 1, 2006, p. 2619.

* cited by examiner

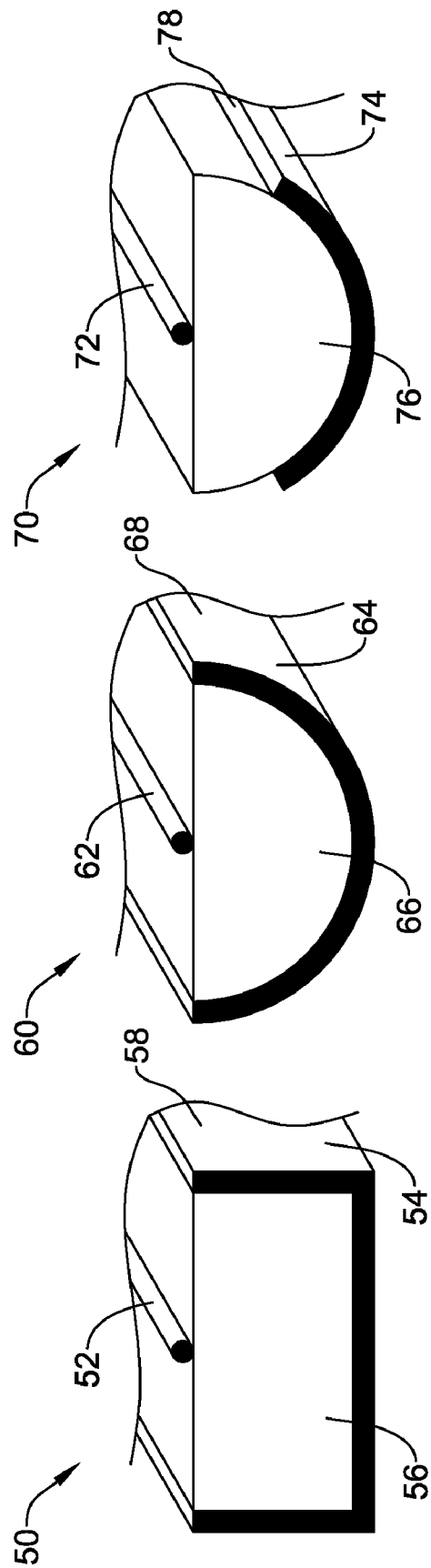

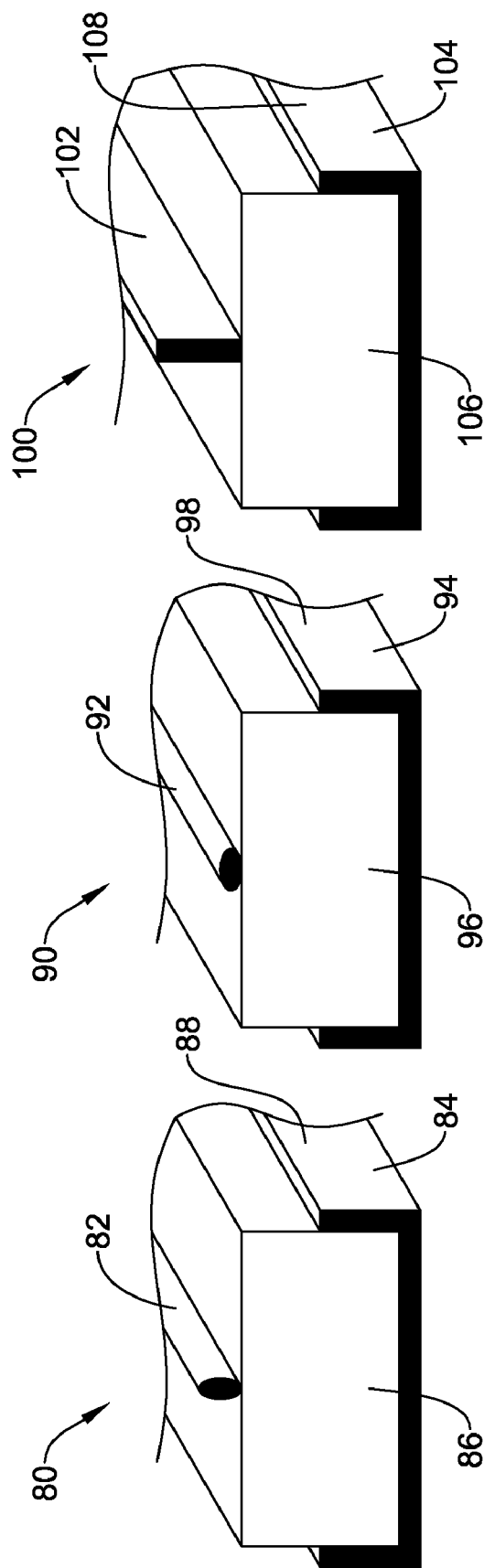

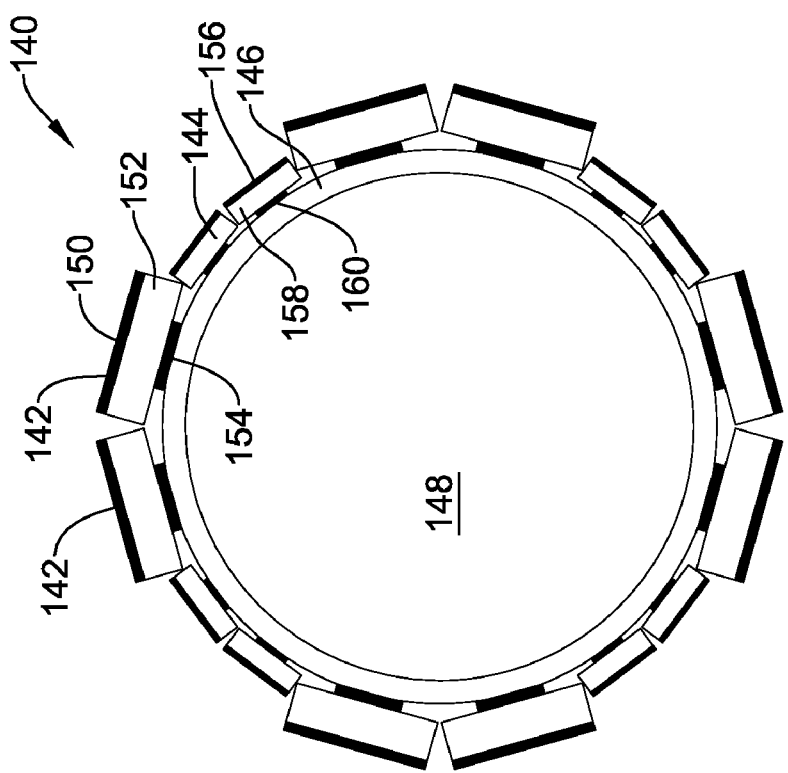
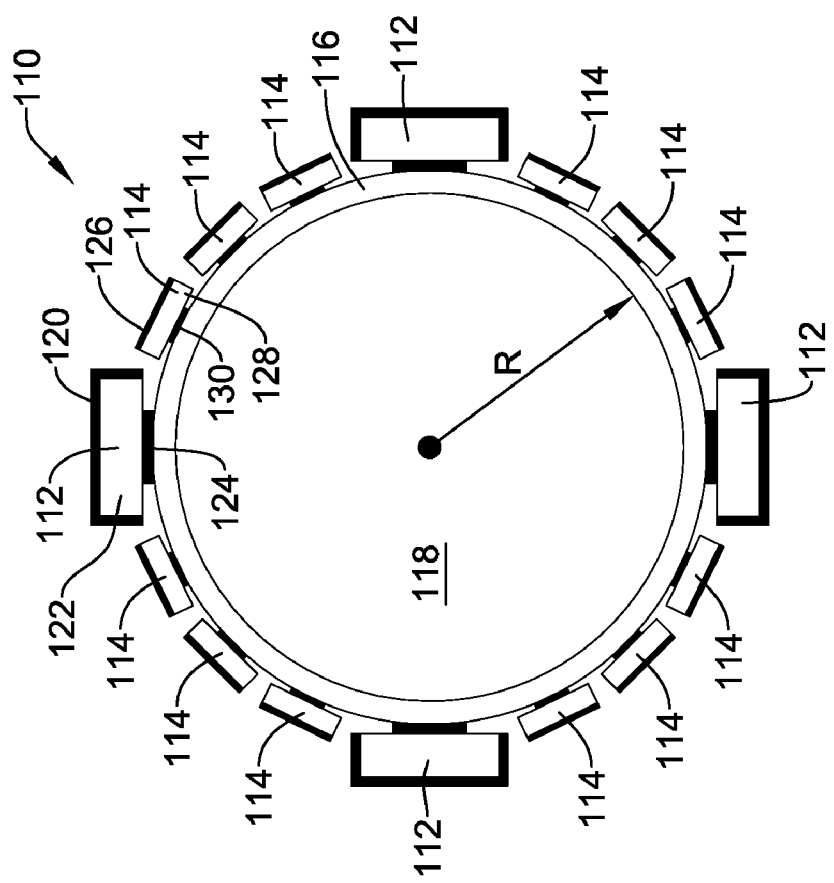
*Figure 12*
*Figure 11*

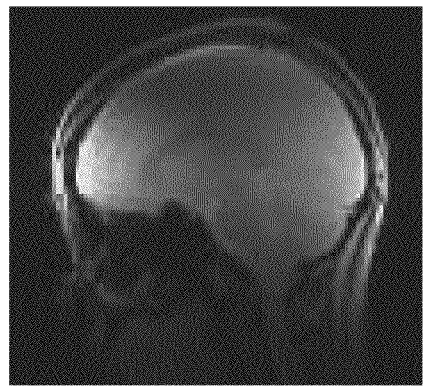
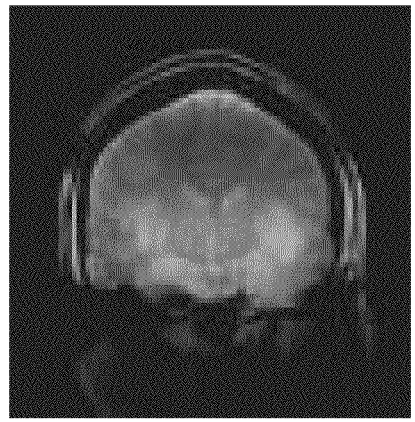
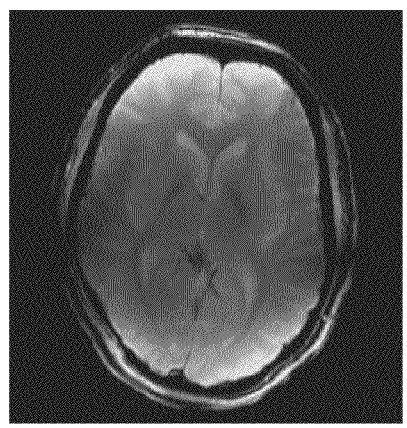
*Figure 41*

US 8,193,809 B2

THREE DIMENSIONAL RF COIL STRUCTURES FOR FIELD PROFILING

CROSS-REFERENCE TO RELATED APPLICATIONS

This application claims the benefit of U.S. Provisional Application No. 60/927,352, filed on May 3, 2007, which is hereby incorporated by reference.

FEDERAL SPONSORSHIP

This application was made with government support under Grant Numbers NIH-R01 EB000895, NIH-R01 EB00331, NIH-P41, RR008079, MIND Institute, W.M. Keck Foundation and BTRR-P41 RR008079. The government may have certain rights to the invention.

FIELD

The present invention relates generally to radio frequency (RF) coils for use with magnetic resonance imaging and spectroscopy, and more particularly, to methods and systems for excitation and detection of magnetic resonance signals with varying transmission line dimensions.

BACKGROUND

Radio frequency (RF) coils have been used in magnetic resonance imaging (MRI) and/or spectroscopy procedures to help obtain an image of tissue under investigation. RF field losses and non-uniformities, which may be caused in part by shortwave attenuation and interference patterns, may impact the image quality of obtained under certain operating conditions. Therefore, there is an ongoing need for a new and/or improved RF coils.

SUMMARY

The following summary is provided to facilitate an understanding of some of the innovative features unique to the present invention and is not intended to be a full description. A full appreciation of the invention can be gained by taking the entire specification, claims, drawings, and abstract as a whole.

In one illustrative embodiment, a radio frequency (RF) coil is disclosed. The RF coil may include a plurality of transmission line elements, wherein at least one of the plurality of transmission line elements may have at least one dimension different than a dimension of another one of the plurality of transmission line elements. In some cases, each of the transmission line elements may include a signal line conductor and a ground plane conductor separated by a dielectric.

In another embodiment, a radio frequency (RF) coil is disclosed. The RF coil may include a plurality of transmission line elements concentrically arranged to define a cavity configured to receive an object to be imaged. One or more first transmission line elements may be configured to image a first portion of the object and one or more second transmission line elements may be configured to image a second portion of the object different than the first portion.

BRIEF DESCRIPTION

The invention may be more completely understood in consideration of the following detailed description of various illustrative embodiments of the invention in connection with the accompanying drawings, in which:

FIGS. 2-10 are perspective cut-away views of illustrative embodiments of resonance elements;

FIGS. 11-15 are end views of illustrative embodiments of RF coils;

Figure 38:
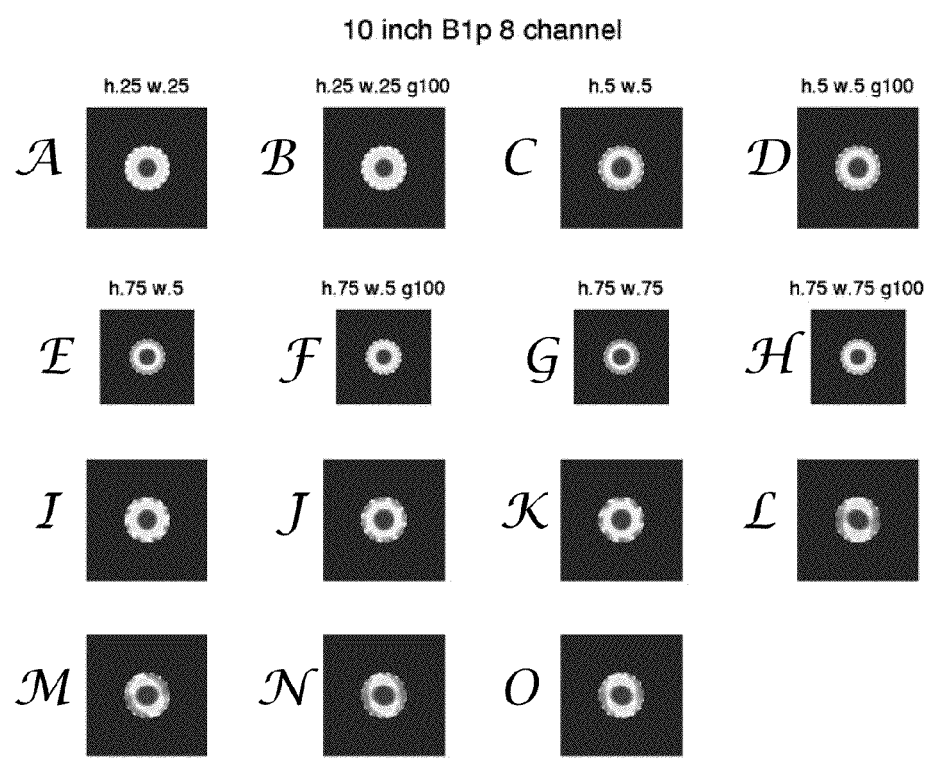
Figure 39:
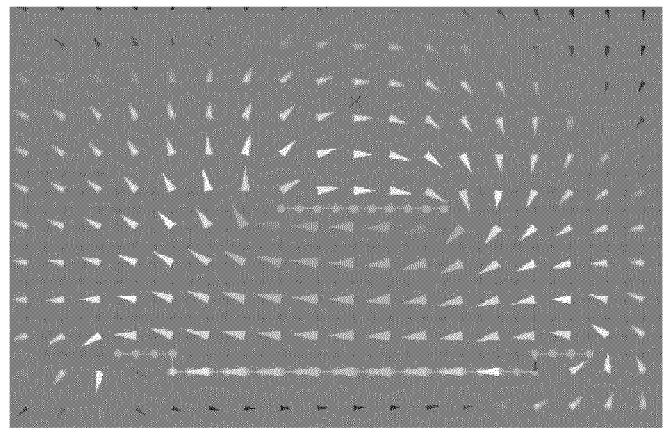
Figure 40:
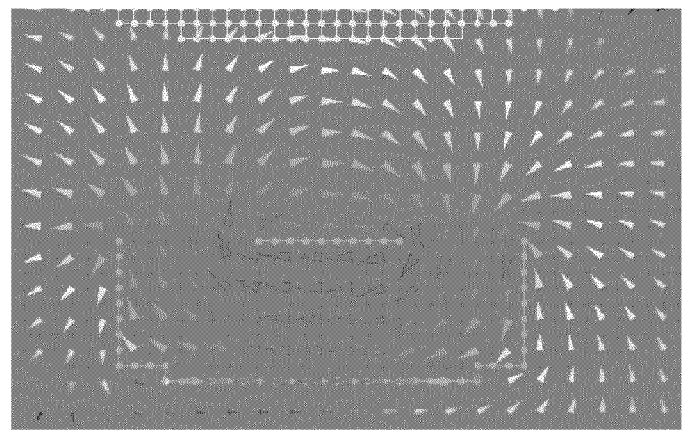

FIGS. 38 A-O are illustrative simulated B (magnetic) field distributions of illustrative RF coils having two resonance elements with varying physical dimensions and/or properties;

FIGS. 39 and 40 are illustrative theoretical vector field plots of resonance elements with varying ground planes; and FIGS. 41A-C are illustrative FLASH images of a human head acquired with an illustrative RC coil.

DETAILED DESCRIPTION

The following description should be read with reference to the drawings wherein like reference numerals indicate like elements throughout the several views. The detailed description and drawings show several embodiments which are meant to be illustrative of the claimed invention.

For simplicity, some of the features and/or elements of the following embodiments have been described with reference to relative terms, including, but not limited to, left, right, top, bottom, up, and down. The use of these and other relative terms is not meant to be limiting in any manner.

Figure 1:
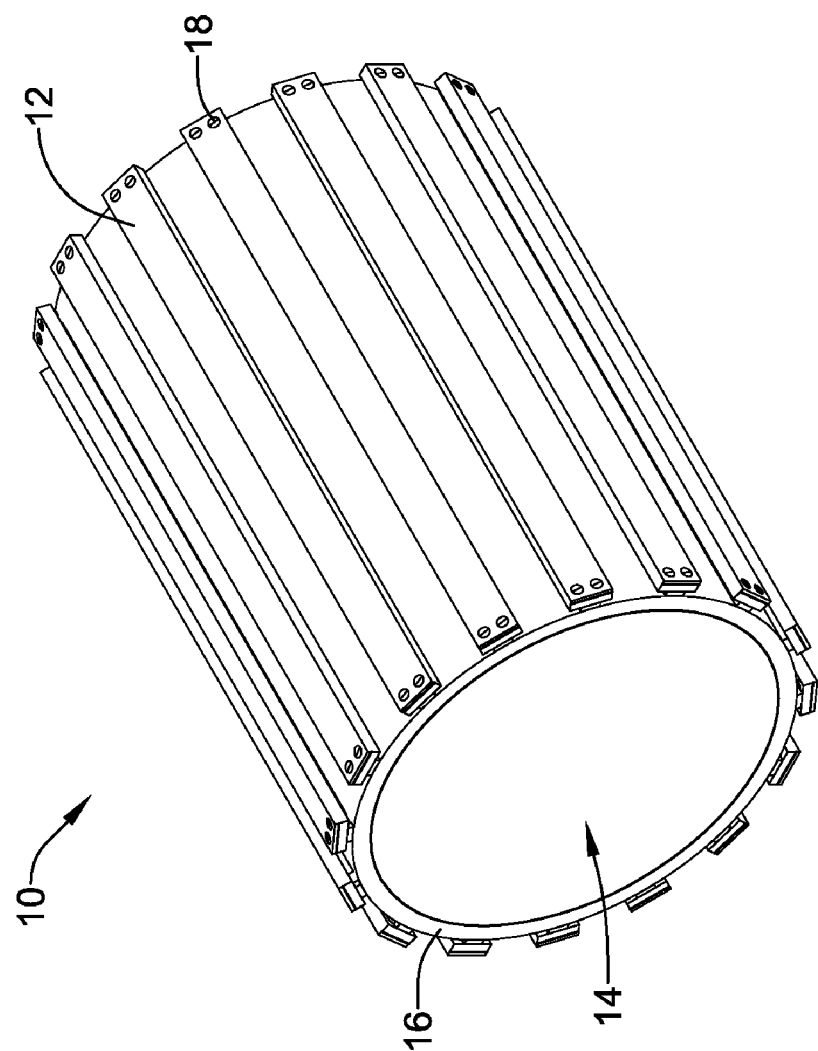
FIG. 1 is a perspective view of an illustrative embodiment of a RF volume coil.

FIG. 1 is a perspective view of an illustrative embodiment of a radio frequency (RF) volume coil 10. In some applications, such as in a magnetic resonance imaging (MRI) system, the RF coil 10 may be positioned within the magnetic field of a main magnet (not shown). In the illustrative embodiment, the RF coil 10 may include a plurality of resonance elements 12. The resonance elements 12 may be elongated members configured for radio frequency transmission, reception, or both transmission and reception during an imaging procedure. In some cases, the resonant elements 12 may include a transmission line or other resonance element having a ground plane and a conductor.

As illustrated in FIG. 1, the plurality of resonance elements 12 may be provided parallel to one another and concentrically arranged to define a cavity 14 configured to receive, at least partially, an object to be imaged. In this arrangement, the ground plane of the resonance elements 12 may be disposed on the exterior portion of the RF coil 10 and the conductor may be disposed on the inner portion of the RF coil 10, adjacent to the cavity 14. In some embodiments, a dielectric material may be provided to separate the conductor from the ground plane.

In the illustrative embodiment, the RF coil 10, or multi-element coil or array system, may include sixteen resonance elements 12 or channels. However, this is not meant to be limiting and it is contemplated that any suitable number of resonance elements 12 may be used, such as, for example four, eight, thirty-two, or any other number of resonance elements 12, as desired.

In the illustrative embodiment, the RF coil 10 may include a cylindrical former 16. In some cases, the former 16 may define, at least in part, the shape of the coil 10. The resonance elements 12 may be securely attached to the former 16 by, for example, one or more screws 18. In the illustrative case, each resonance element 12 may have screws 18 through a portion of the resonance element 12 adjacent to a corner. In some cases, the screws 18 may include a dielectric material, such as, for example, Teflon, however, any suitable dielectric material may be used, as desired. Additionally, it is contemplated that other suitable mechanisms may be used to secure the resonance elements 12 to the framer 16. For example, it is contemplated that a dielectric sheet may be used to secure one or more of the resonance elements to the former 16, as desired.

In some cases, the former 16 may be a non-conducting material. In some cases, the former 16 may be a non-magnetic material. In one case, the former 16 may be formed of a transparent material, but this is not required. In one example, the former 16 may be about one-quarter of an inch thick. In some cases, the individual resonance elements 12 may be individually placed on the former 12 and may be independent of one another. However, any suitable thickness may be used, as desired. Furthermore, it is contemplated that any suitable apparatus may be used to secure the resonance elements 12 to the coil.

In some embodiments, each resonant element 12 may correspond to a channel of the RF coil 10 and, in some cases, each channel may be operated independently of the other channels. However, this is not meant to be limiting and it is contemplated that under certain conditions, two or more of the channels may be operated together, if desired. The multi-channel RF coil 10 can be used for radio frequency transmission, reception, or both transmission and reception.

FIGS. 2-9 are perspective cut-away views of illustrative embodiments of resonance elements. In the illustrative embodiments, the resonant elements may be transmission line elements having a ground plane and a conductor, also referred to as a signal line or strip conductor. As illustrated in the Figures, the signal line and the ground plane may be separated by a dielectric. In some cases, the transmission line may be a microstrip transmission line, but this is not required.

In the illustrative embodiment, the dimensions of the signal line, ground plane, and/or dielectric may be adjusted to control, in part, the RF excitation field. In some cases, the dimensions of the signal line, ground plane, and/or dielectric may affect the magnetic field produced by the respective transmission line. In one example, the depth and/or shape of the field may be adjusted to achieve a desired image. Furthermore, using transmission line elements of varying or different dimensions, the RF coil may be configured to improve images obtained in different portions of the object to be imaged.

In operation, adjusting the dimensions of the transmission line, such as, for example, the width of the ground plane conductor, the height of the dielectric, the height that the ground plane conductor extends along the sides of the dielectric, the size of the strip conductor, and any other dimension, as desired, may affect the magnetic field of the transmission line. For example, the side portions of the ground plane conductor may adjust the circularity of the field and the height of the dielectric may affect the size of the magnetic field. Using these and other dimensions of the transmission lines, the excitation of the field may be controlled.

In the illustrative embodiment, the signal line conductor may be positioned on a first, or inner, side of dielectric and the ground plane conductor may be positioned on a second side of the dielectric. As shown, the first side may be opposite of the second side. In some cases, the signal line conductor and ground plane conductor may include in part or in whole a non-magnetic conductive material, such as, for example, copper or silver. However, it is contemplated that any suitable non-magnetic conductive material may be used, as desired. In some cases, the signal line conductor and the ground plane conductor may include the same material, but this is not required.

In some cases, the ground plane may have a planer, faceted, curved, or arced cross-sectional shape. In some cases, the ground plane may be disposed on three sides of the dielectric and/or may partially encircle the signal line. In other words, the ground plane conductor may include one or more sidewalls that may be disposes along at least a portion of one or more side edges of the dielectric. In some cases, the sidewalls may extend the entire height of the dielectric or only a portion of the height of the dielectric, as desired. However, it is also contemplated that in some embodiments, the ground plane conductor may not include sidewalls.

In some cases, the dielectric may include air, a vacuum, low loss dielectric sheets, such as, for example, Teflon or Duroid, or liquid Helium or liquid Nitrogen, or any other suitable dielectric, as desired. In some cases, the dielectric may have a generally rectangular cross-sectional shape. However, this is not meant to be limiting and it is contemplated that other cross-sectional shapes may be used, as desired. For example, the dielectric may have a semi-circular cross sectional shape or a crescent cross-section shape, if desired.

Figure 2:
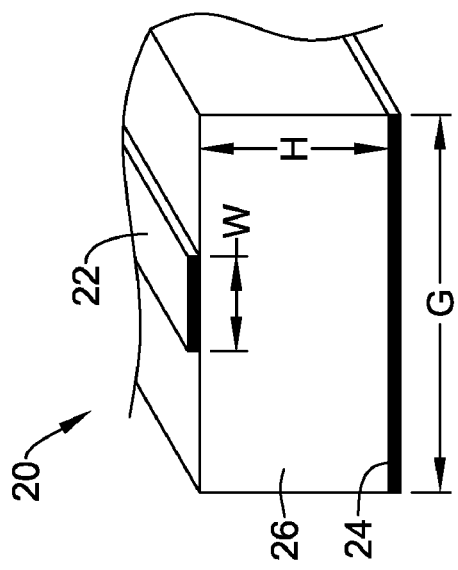

As shown in FIG. 2, the signal line 22 may have a width "w", the ground plane conductor 24 may have a width "g", and dielectric material 26 may have a height "h". In some cases, the transmission line length may be defined as the dimension in the direction of wave propagation, the transmission line height may be defined as the dimension of the direction between the electrical conductors, and transmission line width may be defined as the dimension substantially perpendicular to the length and height. Any of these dimensions may be varied to adjust the excitation field of the coil. In the example shown in FIG. 2, the ground plane 24 may have a width similar to the dielectric 26. The signal line 22 may have a width substantially smaller than the ground plane 24 and the dielectric 26, but this is not required.

Figure 3:
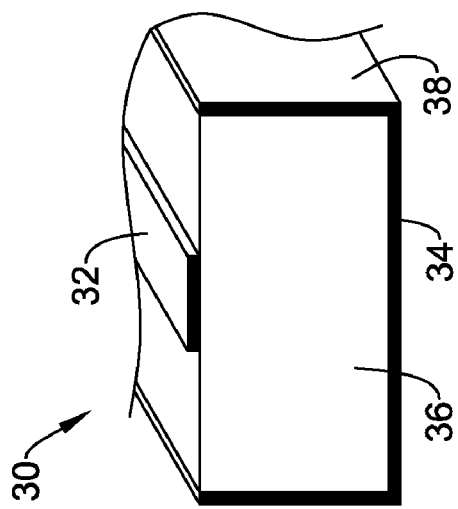

As illustrated in FIG. 3, the ground plane conductor 34 may be disposed on three sides of the dielectric 36. For example, a first portion of the ground plane 34 may be disposed on the relative bottom side of the dielectric 36, a second portion may be disposed on a first side of the dielectric 36 and a third portion may be disposed on a second side of the dielectric 36. As illustrated, the second and third portions of the ground plane conductor 34 may extend along the first and second sides of the dielectric 36 about the entire height "h" of the dielectric 36. In this case, the second and third portions of the ground plane conductor 34 may be defined as the sidewalls 38.

Figure 4:
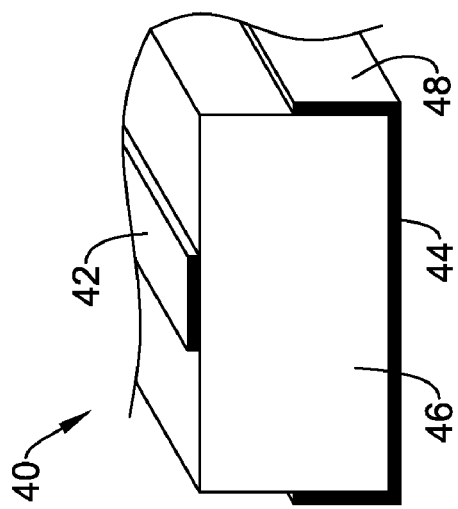

In other embodiments, as shown in FIG. 4, the second and third portions of the ground plane conductor 44, or sidewalls

48, may be disposed on the first and second sides of the dielectric 46 a distance less than the total height "h". For example, the sidewalls 48 may be disposed on 10%, 20%, 25%, 50%, 75%, 100% or any other percentage of the height "h" of the dielectric 46, as desired. Furthermore, it is contemplated that the sidewalls of the ground plane conductor 44 may be different sizes. For example, a relative right sidewall may extend a height greater than or less than the height of the relative left sidewall, if desired.

FIG. 5 is a perspective cut-away view of an illustrative embodiment of a transmission line 50 similar to FIG. 3, except with the dimensions of the signal line 52 varied. As illustrated, the signal line 52 may have a generally circular cross-sectional shape, instead of a generally rectangular cross-sectional shape. The illustrative transmission line element 50 may also include a dielectric 56 separating the signal line conductor 52 from a ground plane conductor 54. In addition, as illustrated, ground plane conductor 54 may include sidewalls 58 extending the entire height of the dielectric 56, but this is not required.

FIGS. 6-7 are perspective cut-away view of illustrative embodiments of transmission line elements 60 and 70 including a dielectric 66 and 76 having a varying shape. As illustrated, the previous Figures, the dielectric has been shown having a generally rectangular cross-sectional shape. In FIGS. 6 and 7, the dielectric 66 and 76 may have a generally semi-circular cross-sectional shape, or in other words, have a flat top portion adjacent to the signal line conductor 62 and 72 and a curved bottom portion adjacent to the ground plane conductor 64 and 74. However, it is contemplated that the flat portion may be adjacent to the ground plane conductor 64 and 74 and the curved portion may be adjacent to the signal line conductor 62 and 72, if desired. In these cases, the ground plane conductors 64 and 74 may be curved. However, it is contemplated that any suitable shape may be used, as desired. In this case, the ground plane may be curved.

In the illustrative embodiments, the ground plane conductors 64 and 74 may include sidewalls 68 and 78. As shown in FIG. 6, the sidewall 68 may extend the entire height of the dielectric 66. However, as shown in FIG. 7, the sidewall 78 may extend only a portion of the height of the dielectric 76, as desired.

Furthermore, while different cross-sectional shapes of the dielectrics have been described, it is also contemplated that the height, length, width, and/or other properties of the dielectrics in the transmission line elements may be varied, as desired.

FIGS. 8-10 are perspective cut-away views of illustrative embodiments of transmission line elements. As illustrated, the cross-sectional shape of the signal line 82, 92, and 102 may also be varied. For example, as illustrated in FIGS. 8 and 9, the signal line conductors 82 and 92 may have a generally elliptical cross-sectional shape. For example, in FIG. 8, the signal line conductor 82 may be configured to have a longer width and shorter height and, in FIG. 9, the signal line conductor 92 may be configured to have a shorter width and a bigger height.

As shown in FIG. 10, the signal line conductor 102 may have a generally rectangular cross-section shape, similar to some of those described previously, except that signal line conductor 102 may be oriented to have a relatively larger height than width. In other words, the signal line conductor 102 may be rotated about 90 degrees as compared to previously shown signal line conductors.

In FIGS. 8-10, each of the signal line conductors 82, 92 and 102, may be separated from the ground plane conductor 84, 94, and 104 by a dielectric 86, 96, and 106, respectively. In addition, ground plane conductors 84, 94, and 104 may include sidewalls 88, 98, and 108, respectively, but this is not required.

Furthermore, it is contemplated that any aforementioned features, dimension, or other variations of any of the transmission line elements may be combined with any other features, dimension, or other variations of any other transmission line element, as desired.

FIGS. 11-15 are end views of illustrative embodiments of RF coils. In the illustrative embodiments, the RF coils may include a plurality of transmission line elements. In some cases, the plurality of transmission line elements may include any of the above-described transmission line elements or any combination of the above-described transmission line elements, as desired. In some cases, the RF coils may be a "two-stage" multi-channel, microstrip TEM coil having a plurality of transmission line elements or channels. In some embodiments, at least one of the plurality of transmission line elements may have at least one dimension and/or property that is different than a corresponding dimension and/or property of another one of the plurality of transmission line elements.

In the illustrative RF coil, the plurality of transmission line elements may be designed and arrayed in three-dimensions to help improve RF field dependent parameters, such as, for example, homogeneity, specific absorption rate (SAR), signal-to-noise ratio (SNR), contrast, localization, as well as other parameters. In some cases, the illustrative RF coil may be configured to couple some of the plurality of transmission line elements to a first portion of the object and others of the plurality of transmission line elements to a second portion of the object. In one example, the illustrative RF coil may be designed to couple a first number of the plurality of transmission line elements to the center of the object to be imaged and to couple a second number of the plurality of transmission line elements to the periphery of the object to be imaged. As discussed previously, in some cases, this may be accomplished by configuring the first number of transmission line elements to have relatively deeper fields and the second number of transmission line elements to have relatively shallower fields. For some applications, the superposition of the shallow and deep fields of the illustrative two-stage RF coil may produce a B1 excitation field that may have a more uniform image, such as, for example, at the center and the periphery, and may consume less power.

To adjust the fields of the plurality of transmission elements, such as, for example, so that some of the plurality of transmission elements are configured to help improve the SNR in the periphery and other ones of the plurality of transmission elements are configured to help improve the SNR in the center of the coil, the dimensions of the transmission line elements may vary. For example, in some cases, the ground plane conductor widths (g), the dielectric substrate heights (h), the presence and/or height of the ground plane conductor sidewalls, the dielectric substrate cross-sectional shape, the signal line width (w), the signal line cross-sectional shape, and/or other dimensions may be varied among the plurality of transmission line elements to achieve desired $B_1$ field penetration depths.

In some cases, the illustrative RF coils may include two sets of transmission line elements, each set having at least one dimension different than the other set. Furthermore, it is contemplated that the coil may include three, four, five, six, or any number of sets of transmission line elements, as desired, with each set being different than the other sets. Additionally, it is contemplated that the sets may include the same number of transmission line elements or a different number of transmission line elements, as desired.

In some cases, the transmission line elements having varying dimensions may be arranged in a desired configuration or pattern around the coil. For example, the arrangement or pattern may alternate between the transmission line elements. In some cases, the alternating may include one or more transmission line elements from the first set, then one or more transmission line elements from the second set, and so forth. However, this is not meant to be limiting and it is contemplated that the transmission line elements may be arranged in any configuration around the coil or randomly arranged about the coil, as desired. In one example, the RF coils may be designed so that alternating transmission line elements couple to the center and periphery of the object to be imaged.

Additionally, for simplicity, FIGS. 11-15 of the present application are shown with sixteen transmission lines. This is merely illustrative and is not meant to be limiting in any manner. It is contemplated that any number of transmission line elements may be used, as desired.

Furthermore, each of the transmission line elements may be spaced a distance "R" (shown in FIG. 11) from the center of the coil. In some cases, the distance R for all the transmission line elements may be the same. In other cases, the transmission line elements within a set may have the same distance R, but the different sets may have different distances R. Further, in other cases, it is contemplated that any or all of the transmission lines may be spaced a different distance from the center of the coil, as desired.

In the illustrative embodiment, the RF coils may be used in a variety of static magnetic fields, which may be generated by the main magnet. For example, the field strength may range from about 0.5 to 20 Tesla, 2 to 15 Tesla, 5 to 10 Tesla, 7 to 8 Tesla, or any other suitable range of magnetic fields or magnetic field, as desired.

In some cases, the illustrative RF coil may generate a field with a first set including transmission line elements having uniform dimensions and the RF coil may detect a signal using a set of transmission line elements having uniform dimensions, but the second set having dimensions different than the first set, but this is not required. In some cases, the detecting may include encoding along the direction of wave propagation of the transmission line element. In some cases, generating may include modulating at least one of a current, a frequency, a phase angle, space and timing.

FIG. 11 is an end view of an illustrative embodiment of a RF coil 110. As can be seen, the coil 110 may include a framer 116 defining a cavity 118 configured to receive an object to be imaged. A plurality of transmission line elements 114 and 112 may be concentrically disposed about the framer 116. In the illustrative case, the coil 110 may include two sets of transmission line elements 112 and 114. A first set including transmission line elements 112 may be relatively larger than a second set including transmission line elements 114. In other words, transmission line elements 112 may include dielectrics 122 having a greater height than the dielectric 128 of transmission line elements 114.

In the illustrative case, there are four relatively thick transmission line elements 112, each separated by three relatively thin transmission line elements 114. In this case, each of the transmission line elements 112 may include a ground plane 120 including sidewalls disposed on sides of the dielectric 122. Also, the signal line 124 appears to have a generally rectangular cross-sectional shape. Additionally, transmission line elements 114 may include a ground plane conductor 126 including no sidewalls. Signal line conductor 130 of transmission line element 114 may have a generally rectangular cross-sectional shape. However, it is contemplated that any of the signal line and ground plane dimensions, or combination of dimensions, for the transmission line elements 112 and 114 disclosed herein may be used, as desired.

FIG. 12 is an end view of an illustrative embodiment of an RF coil 140. In this embodiment, the transmission line elements 142 and 144 may be arranged in an alternating two-by-two arrangement. In other words, two relatively thick transmission line elements 142 may be provided, then two relatively thin transmission line elements 144, then two thick transmission line elements 142, and so forth. In this case, there may be eight relatively thick transmission line elements 142 and eight relatively thin transmission line elements 144. Again, in other words, transmission line elements 142 may include a dielectric 152 having a greater height than dielectric 158 of transmission line elements 144.

As illustrated, each of the transmission line elements 142 and 144 may include a ground plane 150 and 156 including no sidewalls, but this is not required. Also, the signal line conductors 154 and 160 may have a generally rectangular cross-sectional shape. However, it is contemplated that any of the signal line and ground plane dimensions or any combination of dimensions for the transmission line elements disclosed herein may be used, as desired.

Figure 13:
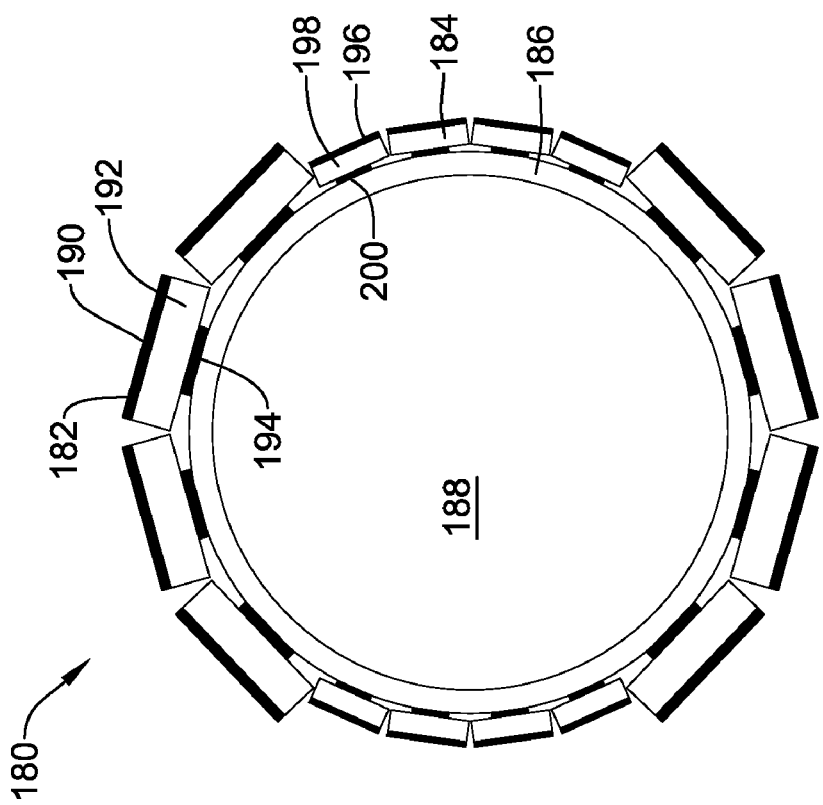

FIG. 13 is an end view of an illustrative embodiment of a RF coil 180. In this embodiment, the transmission line elements 182 and 184 may be arranged in a four-by-four alternating arrangement. In other words, the illustrative RF coil 180 may include four relatively thick transmission line elements 182, then four relatively thin transmission line elements 184, then four relatively thick transmission line elements 182, and then four relatively thin transmission line elements 184. In other words, dielectric 192 of transmission line elements 182 may have a relatively larger height than dielectric 198 of transmission line elements 184.

As illustrated in this embodiment, each of the relatively thin transmission line elements 184 may include a ground plane 196 separated from the signal line 200 by the dielectric 198. Also, ground plane conductor 196 may include no sidewalls, but this is not required. Similarly, each of the transmission line elements 182 may include a ground plane 190 separated from the signal line 194 by the dielectric 192. Also, ground plane conductor 190 may include no sidewalls, but this is not required. However, it is contemplated that any of the signal line and ground plane dimensions or any combination of dimensions for the transmission line elements disclosed herein may be used, as desired.

Figure 14:
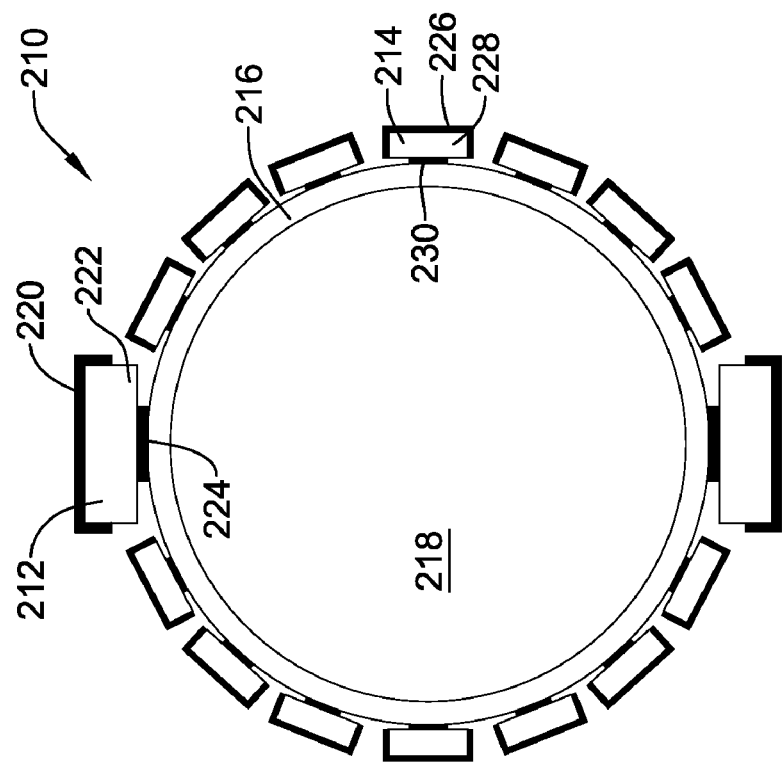

FIG. 14 is an end view of an illustrative embodiment of a RF coil 210. In this embodiment, the transmission line elements may be arranged to in and one-by-seven alternating configuration. In other words, RF coil 210 may include one relatively thick transmission line element 212, then seven relatively thin transmission line elements 214, then one relatively thick transmission line element 212, and then seven relatively thin transmission line elements 214. In the illustrative embodiment, transmission line element 212 may include a dielectric 22 having a larger height than dielectric 228 of transmission line element 214.

In the illustrative embodiment, each of the transmission line elements 212 and 214 may include a ground plane 220 and 226 including sidewalls. As shown in transmission line 212, sidewalls may extend only a portion of the height of the dielectric 222 whereas in transmission line 214, sidewalls may extend substantially the entire height of the dielectric 228. However, any suitable sidewalls may be used, as desired. In addition, signal line conductors 224 and 230 appear to have a generally rectangular cross-sectional shape. However, it is contemplated that any of the signal line and ground plane dimension or any combination of dimensions for the transmission line elements disclosed herein may be used, as desired.

Figure 15:
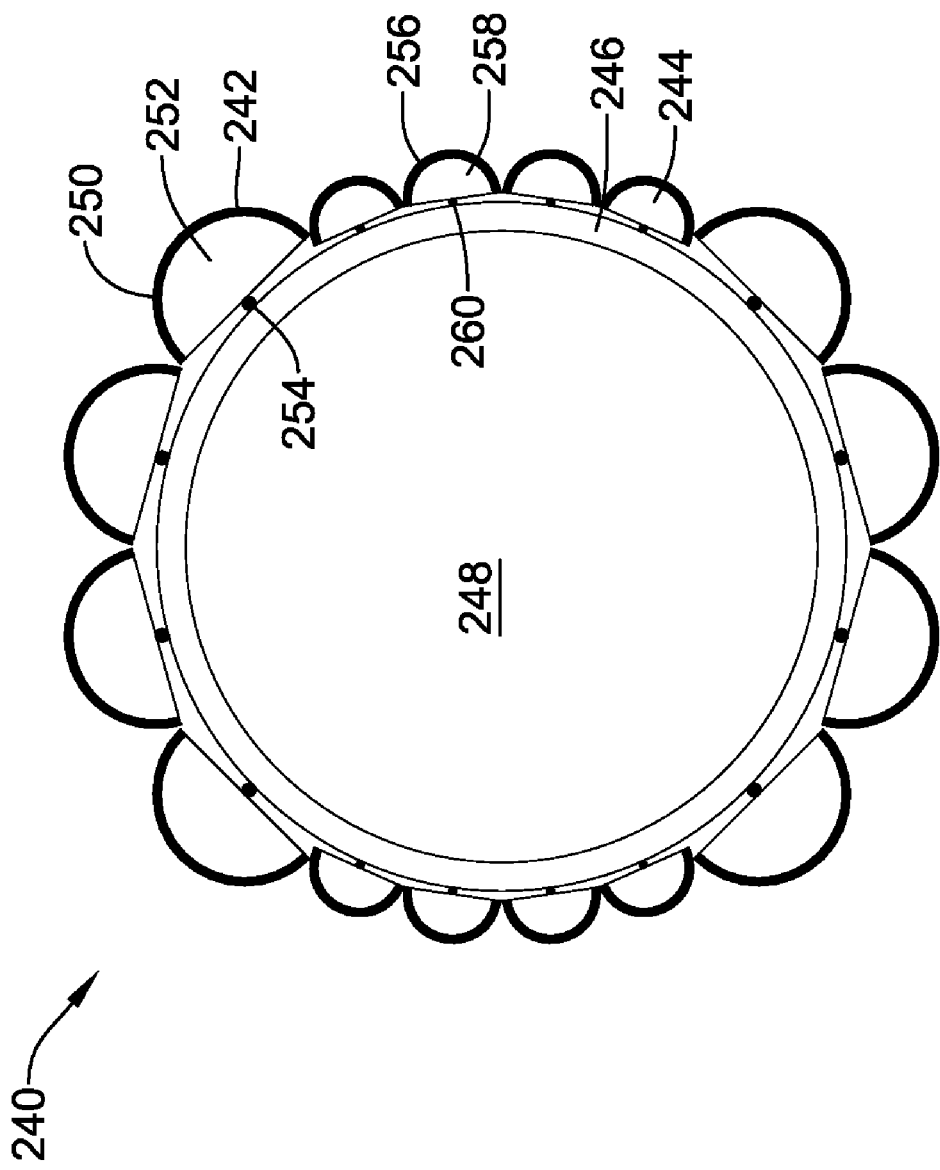

FIG. 15 is an end view of an illustrative embodiment of a RF coil 240. In the illustrative embodiment, the transmission line elements may be arranged in a four-by-four alternating arrangement. In other words, the RF coils 240 may include four relatively thick transmission line elements 242, then four relatively thin transmission line elements 244, then four relatively thick transmission line elements 242, and then four relatively thin transmission line elements 244. As illustrated, dielectric 252 of transmission line elements 242 may have a larger height than dielectric 258 of transmission line elements 244.

In the illustrative embodiment, transmission line elements 242 and 244 may include a ground plane conductor 250 and 256 having a generally curved or arced shape. In this case, dielectrics 252 and 258 may have a generally semi-circular cross-sectional shape. However, it is contemplated that either ground plane conductors 250 and 256 may be generally flat and/or dielectrics 252 and 258 may be generally rectangular in cross-sectional shapes, if desired.

Additionally, signal line conductors 254 and 260 may be configured to have a generally circular cross-sectional shape. However, it is contemplated that some of the signal line conductors may be elliptical, circular, rectangular, or any combination thereof, as desired. Furthermore, it is contemplated that any of the signal line and ground plane dimensions or any combination of dimensions for the transmission line elements disclosed herein may be used, as desired.

Figure 16:
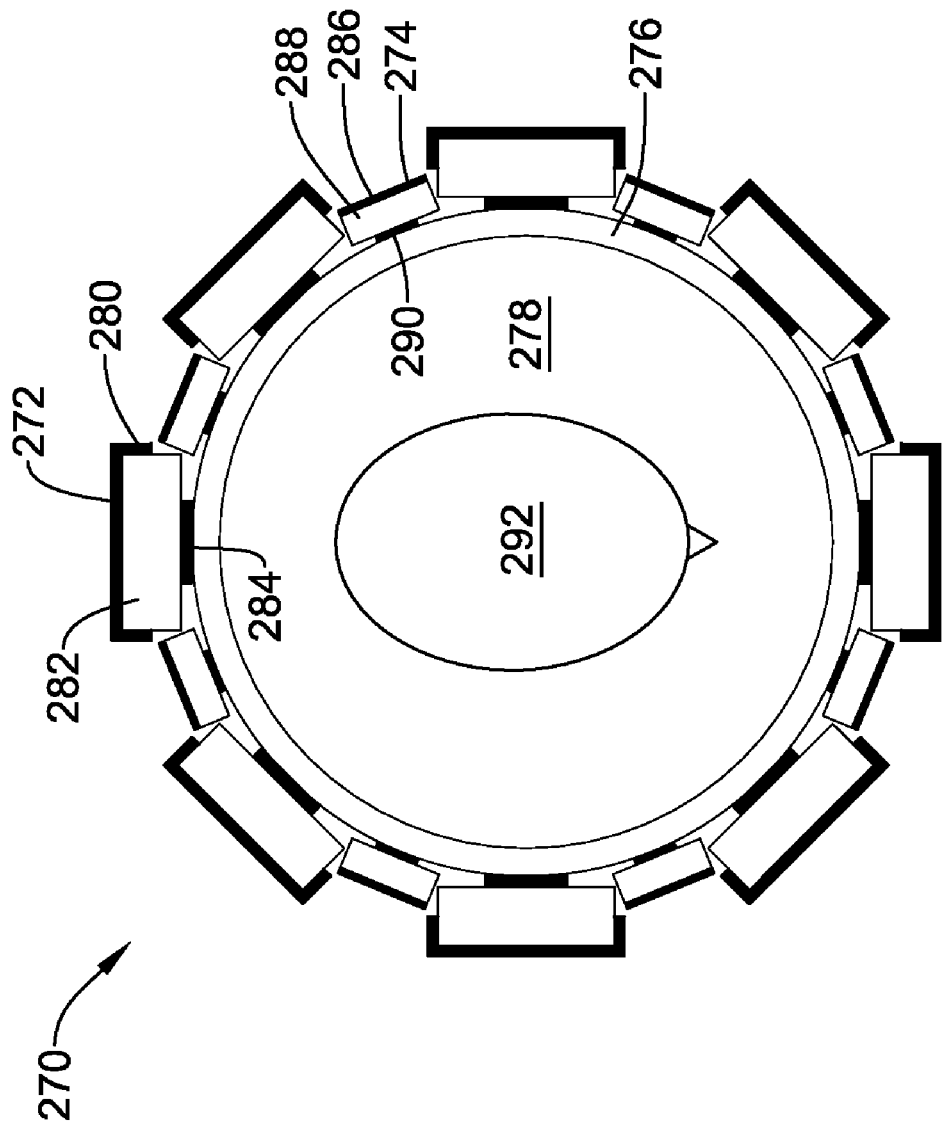
FIG. 16 is an illustrative embodiment of a RF coil including an object to be imaged.

FIG. 16 is an end view of an illustrative embodiment of an RF coil 270 including an object 292 to be imaged. In the illustrative embodiment, the RF coil 270 may include a plurality of transmission line elements 272 and 274. In the illustrative case, the transmission line elements 272 and 274 may be arranged in a one-by-one alternating arrangement about the former 276. For example, this arrangement may include a set of relatively thick transmission line elements 272 and a set of relatively thin transmission line element 274.

In the illustrative embodiment, transmission line elements 272 may include a dielectric 282 having a relatively larger height than dielectric 288 of transmission line elements 274. As illustrated, ground plane conductor 280 of transmission line element 272 may include sidewalls, but this is not required. In the illustrative case, the sidewalls may extend only a portion of the height of the dielectric 282, however, any suitable height of the sidewalls may be used, as desired.

In the illustrative embodiment, the relatively thin transmission line element 274 may include a ground plane 286 and a signal line 290 separated by a dielectric 288. As illustrated, the ground plane 286 is configured to not include any sidewalls, but this is not required.

Additionally, the object 292 to be imaged may be positioned at least partially within the cavity 278 of RF coil 270. In the illustrative embodiment, the object 292 may be a head. However, it is contemplated that any suitable object 292 having tissue to be imaged, such as, for example, a hand, an arm, a leg, a foot, a torso, or any other suitable object, as desired.

Figure 17:
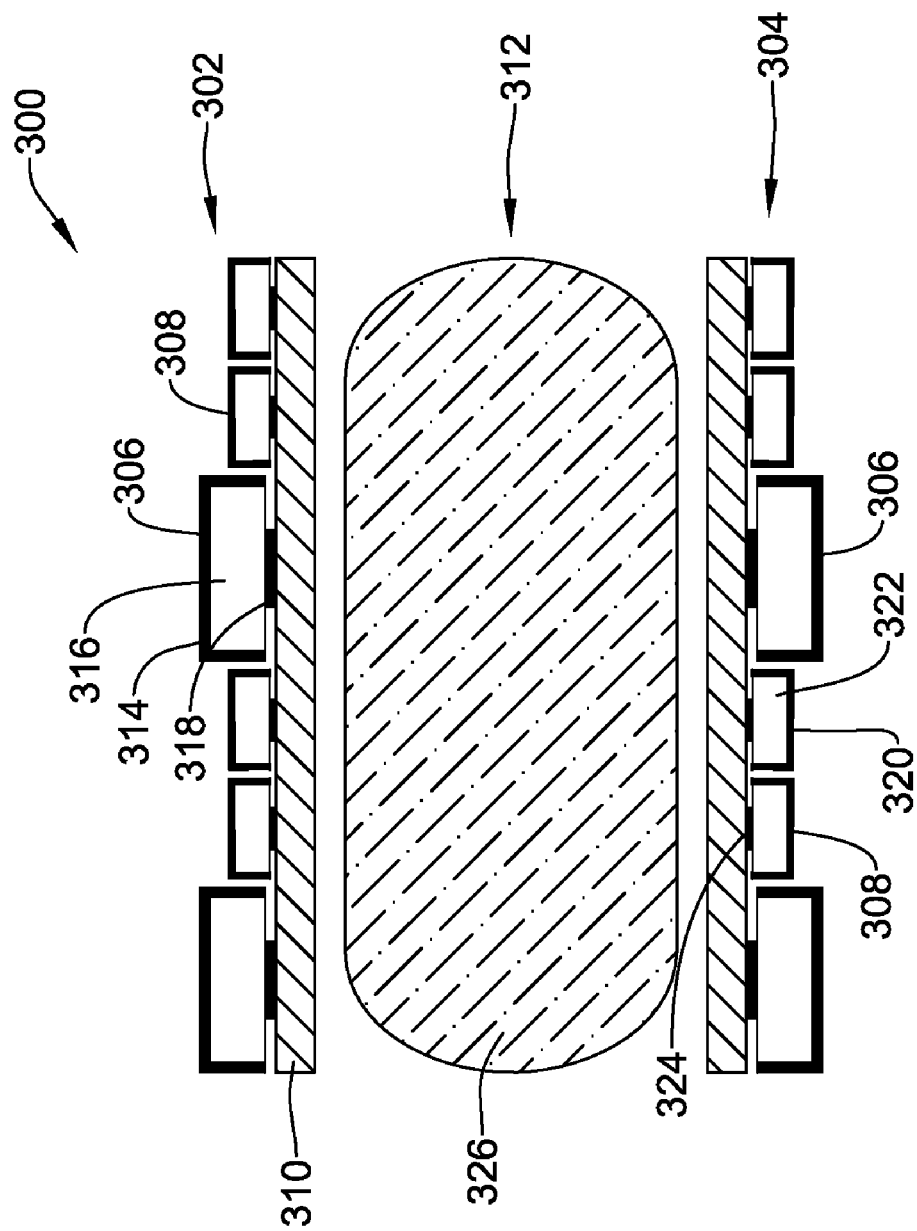
FIGS. 17-18 are end views of illustrative embodiments of a surface RF coil including an object to be imaged.

FIG. 17 is an end view of an illustrative embodiment of another RF coil 300. In the illustrative embodiment, the RF coil 300 may be a surface coil. As illustrated, the RF coil may include a first array 302 of transmission line elements 306 and 308 disposed on former 310 and a second array 304 transmission line elements 306 and 308 disposed on form 310. In some applications, the arrays 302 and 304 may be placed on opposite sides of an object 326 during an imaging procedure, but this is not required. In some cases, the first array 302 and the second array 304 may define an imaging area 312 configured to receive at least a portion of an object 326 to be imaged. In some cases, the imaging area 312 may be a cavity, but this is not required.

As illustrated, both the arrays 302 and 304 may include one or more relatively thick transmission line elements 306 and one or more relatively thin transmission line elements 308. Each of the relatively thick and thin transmission line elements 306 and 308 may include a ground plane 314 and 320 and a signal line 318 and 324 separated by a dielectric 316 and 322, respectively. As illustrated, dielectric 316 may have a relatively larger height than dielectric 322. As illustrated, each ground plane 314 and 320 may be configured to have sidewalls extending the height of the dielectrics 316 and 322, but this is not required.

In the illustrative embodiment, each array 302 and 304 may be arranged in a one-by-two alternating arrangement, or, in other words, each array 302 and 304 of transmission line elements 306 and 308 may be configured to have one transmission line element 306, then two transmission line elements 308, then one transmission line element 306, and then two transmission line elements 308. However, it is contemplated that any suitable arrangement may be used, as desired.

Figure 18:
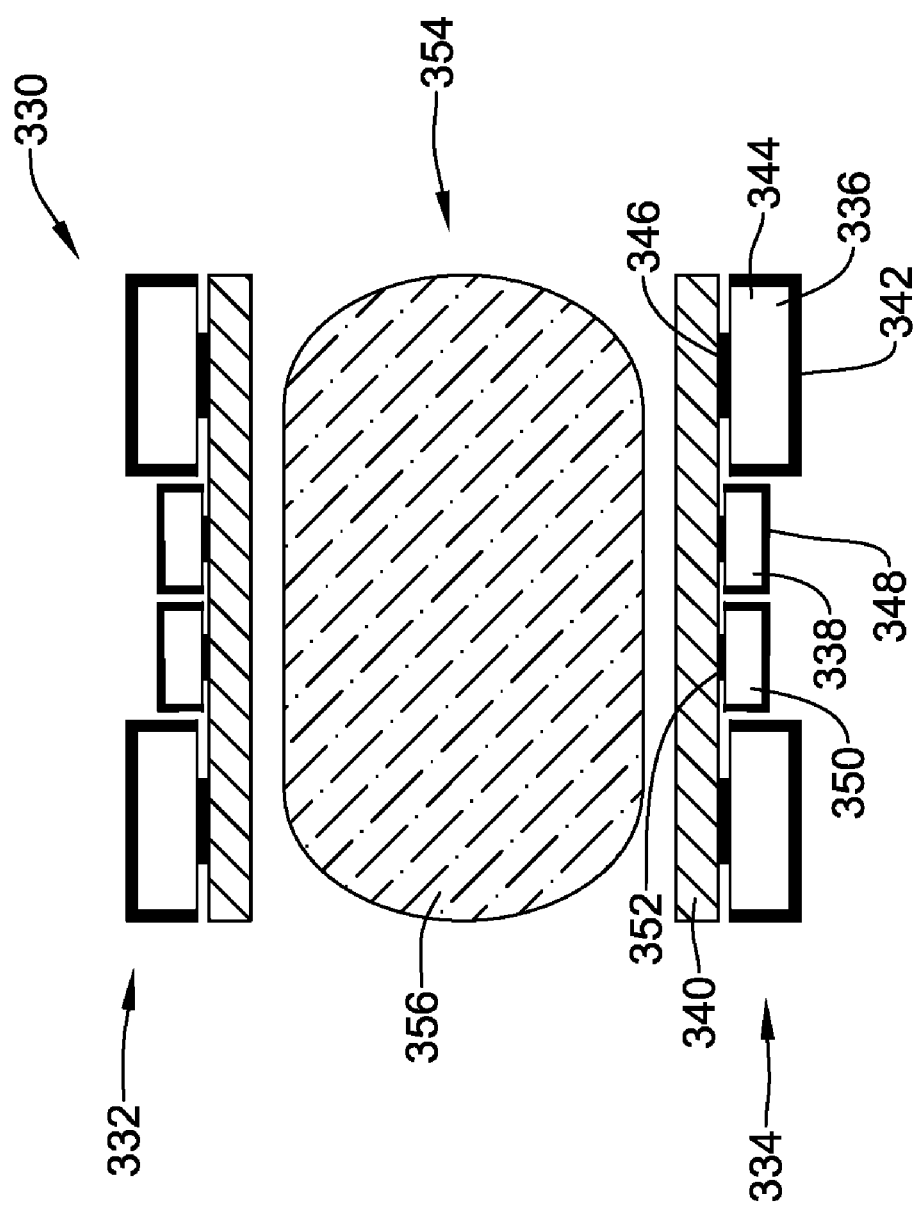
Figure 20:
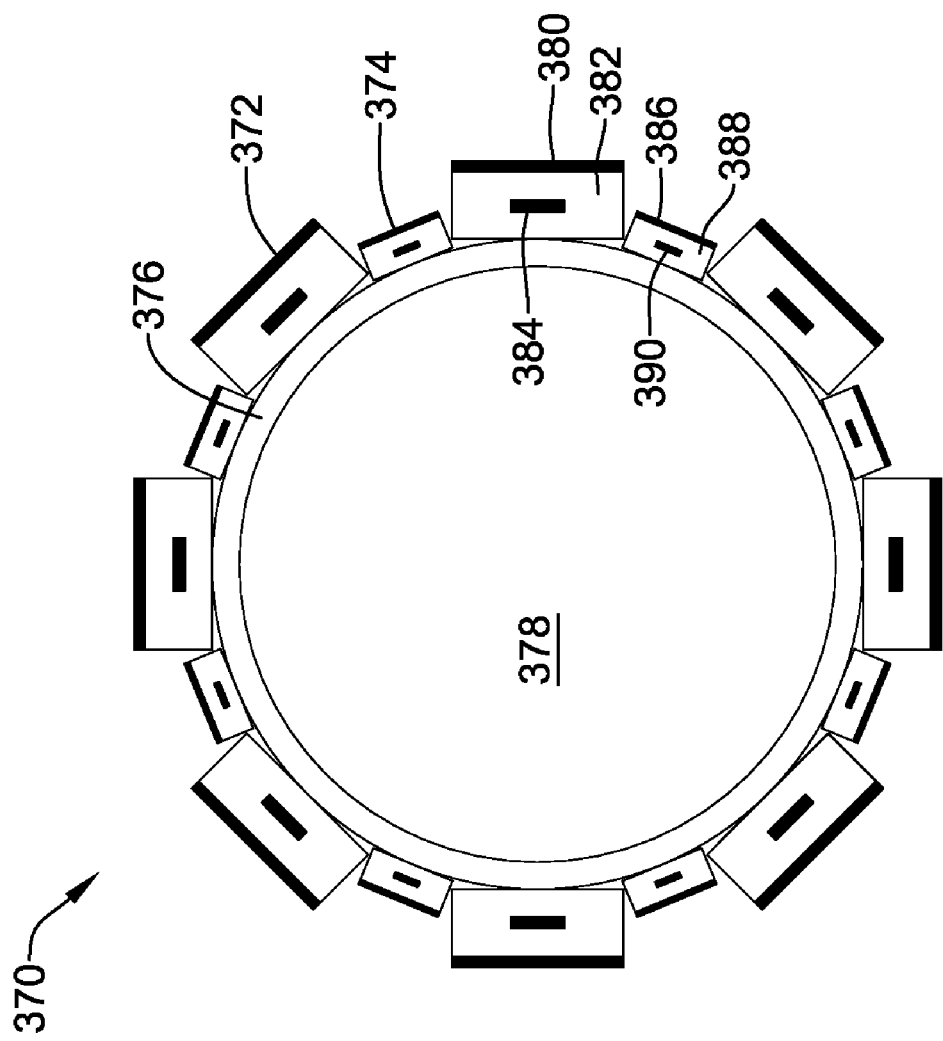
FIG. 20 is an end view of illustrative embodiments of a RF coils including the resonance element of FIG. 19.

FIG. 18 is an end view of an illustrative embodiment of a RF coil 330. RF coil 330 may be similar to RF coil 300 of FIG. 17, except that RF coil 330 may be arranged to have one relatively thick transmission line element 336, two relatively thin transmission line elements 338, and then one relatively thick transmission line element 336.

As illustrated, RF coil 330 may include two arrays of transmission line elements 332 and 334 provided adjacent to or secured to framer 340. Additionally, each array 332 and 334 may include one or more relatively thick transmission line elements 336 and one or more relatively thin transmission line elements 338. Each transmission line element 336 and 338 may include a ground plane 342 and 348 and a signal line 346 and 352 separated by a dielectric 344 and 350. Also, ground plane conductors 342 and 348 may include sidewalls extending about the entire height of the dielectric 344 and 350, but this is not required.

While the illustrative embodiments of FIGS. 17 and 18 are shown with transmission line elements on a relative top side and relative bottom side, it is contemplated that the transmission line elements may be on any number or combination of the sides of the object. For example, the transmission line elements may be on one, two, three, or four sides of the object to be imaged, as desired. Also, it is contemplated that the transmission line elements may be on the relative right side, left side, top side, bottom side, front side, and/or back side, or any combination thereof, as desired.

Figure 19:
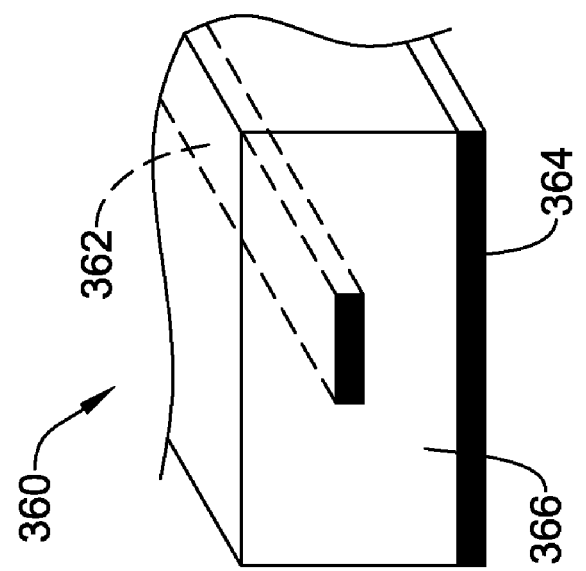
FIG. 19 is a perspective cut-away view of illustrative embodiments of a resonance element including an embedded signal line.

FIG. 19 is a perspective cut-out view of an illustrative embodiment of a transmission line element 360. Similar to the transmission line elements discussed previously, transmission line element 360 may include a ground plane 364 and a signal line 362 separated by a dielectric 366. However, in the illustrative embodiment, signal line 362 may be at least partially embedded within the dielectric 366.

Although not expressly shown, it is contemplated that transmission line element 360 may be configured to include any of the dimensions or features discussed previously, such as, for example, a ground plane sidewall, a curved ground plane, a signal line having a different cross-sectional shape, as well as any other variation, as desired.

FIG. 19 is an end view of an illustrative embodiment of an RF coil 370. In the illustrative embodiment, the RF coil 370 may include a plurality of transmission line elements 372 and 374. In the illustrative case, the RF coil 370 may be arranged in a one-by-one alternating arrangement about the former 376. As illustrated, dielectric 382 may have a relatively larger height than dielectric 388. In this case, transmission line elements 372 may form a first set of relatively thick transmission line elements and transmission line elements 374 may form a set of relatively thin transmission line element.

In the illustrative embodiment, the transmission line elements 372 and 374 may include a ground plane 380 and 386 and a signal line 384 and 390 separated by a dielectric 382 and 388. In the illustrative embodiment, the signal lines 384 and 390 may be embedded within the dielectric, similar to transmission line 360 of FIG. 19. Additionally, while the signal line 384 and 390 is shown as being embedded in all the transmission line elements 372 and 372, this is not required. It is contemplated that some of the signal lines 384 and/or 390 may be embedded while other signal lines 384 and/or 390 may not be embedded, as desired.

As illustrated, ground planes 380 and 386 may include no sidewalls. However, this is not meant to be limiting and it is contemplated that in some embodiments, sidewalls may be provided, as desired.

Figure 21:
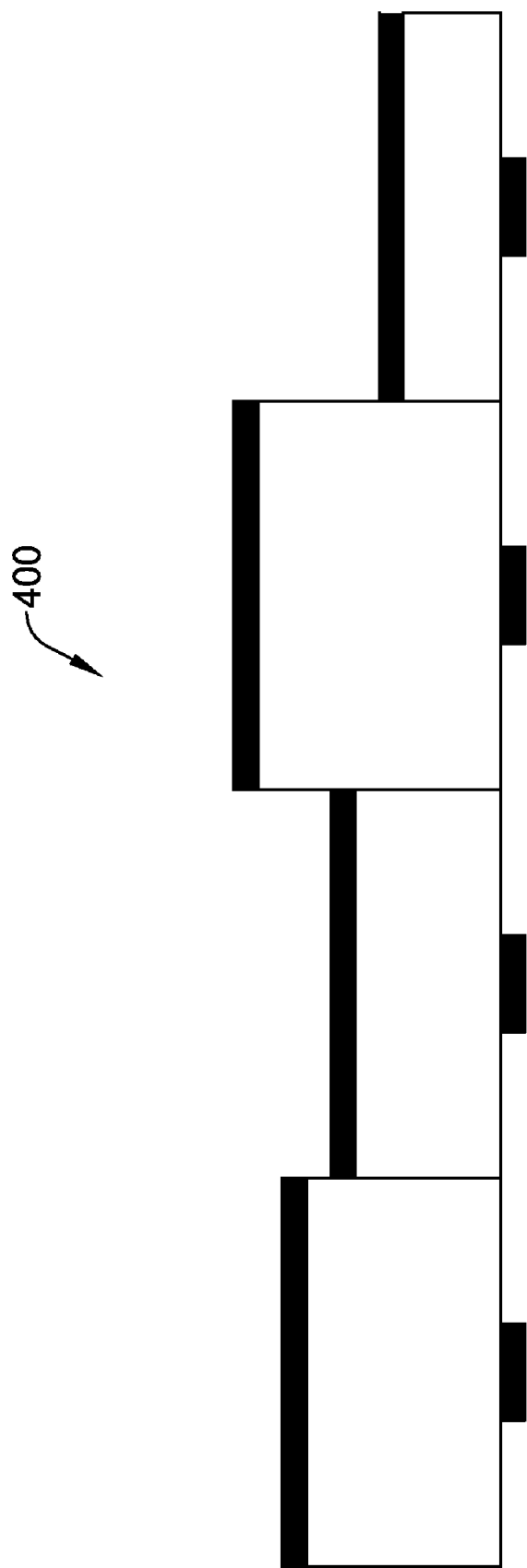
FIG. 21-23 are end views of illustrative embodiments of arrays of resonance elements.

FIG. 21 is an end view of an illustrative array 400 of transmission line elements. For simplicity, the transmission line elements are shown abutting one another, but this is not required. The illustrative array 400 shows that dielectric may be varied among the transmission line elements. For example, as shown in FIG. 21, the height of the dielectric is varied among the transmission line elements.

Figure 22:
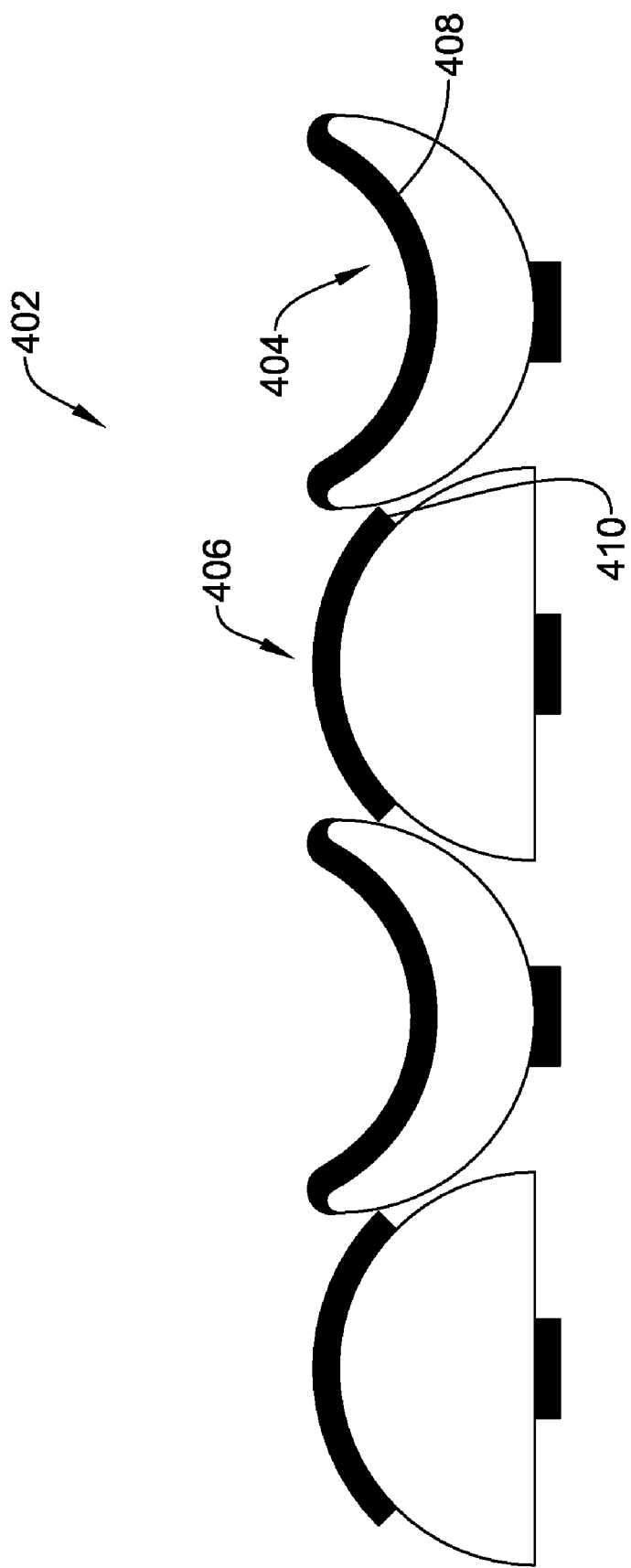

FIG. 22 is an end view of another illustrative array 402 of transmission line elements. In the illustrative embodiment, the ground planes 408 and 410 may be generally curved for each transmission line elements. As illustrative, the direction of the ground plane curve may vary. For example, in transmission line element 406, the dielectric may have a semicircular cross-sectional shape and transmission line element 404 may have a crescent cross-sectional shape.

Figure 23:
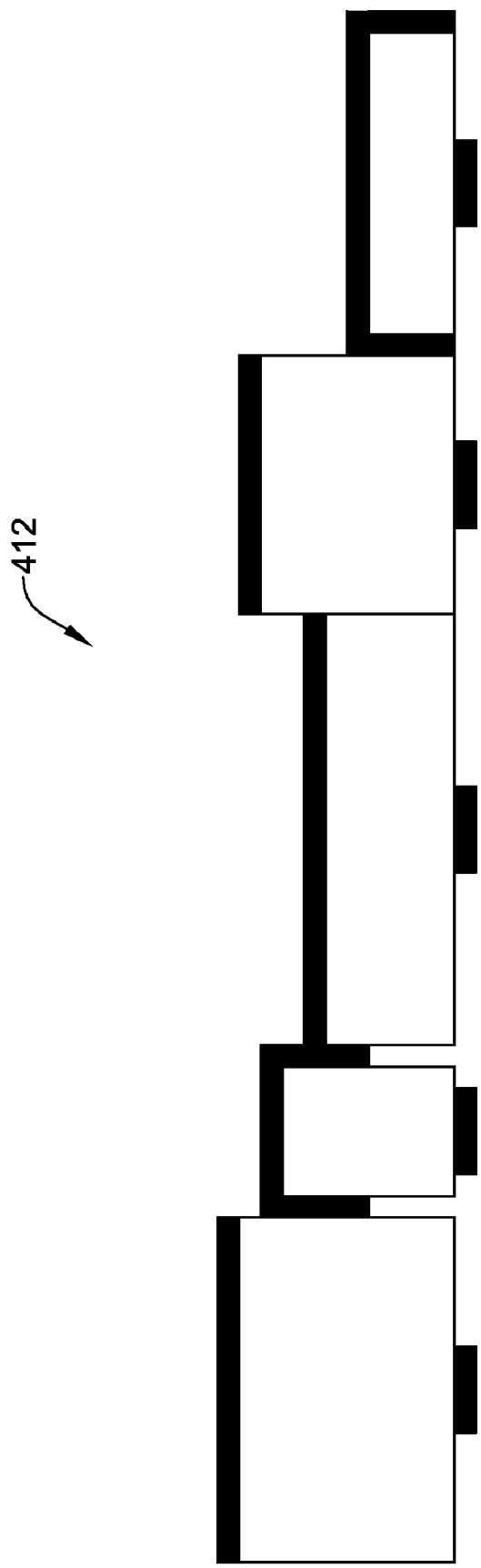

FIG. 23 is an end view of another illustrative array 412 of transmission line elements. In the illustrative array 412, the ground plane shape, the dielectric height, and the dielectric width of the transmission line elements may be varied.

Theoretical Examples

Theoretical $B_1$ magnitude field patterns were obtained at 300 MHz with numerical Maxwell solutions of microstrip-based volume coils calculated using XFDTD (Remcom Inc., State College, Pa.). In one example, a sixteen channel volume coil with an inner diameter of 10 inches and length of 5.5 inches having Teflon as a dielectric substrate ($\in_r$=2.2) with a 7 inch diameter saline sphere phantom (conductivity=0.9 and permittivity=78) placed in the center of the coil. Introduction of sidewalls for the ground plane were analyzed for SNR performance for the 0.5 inch signal line width, 0.5 inch dielectric substrate height and 2.0 inch ground plane width. In another example, while maintaining the same ratio between the signal line width and dielectric substrate height, the height of the substrate was increased to 0.75 inch (the resultant signal line width was 0.75 inch) was also theoretically investigated.

In the illustrative example, all of the transmission line elements were driven independently and tuned to 298 MHz. To compare the performance of the different microstrip element configurations, the SNR maps were normalized to input powers for evaluation of receive profiles as a function of power of the respective coil configurations.

In another theoretical example, the two transmission line element designs where incorporated into a single a sixteen-channel coil. The transmission line elements included eight relatively thin strips (0.5 inch width, 0.5 inch height, and sidewalls) and eight relatively thick strips (0.75 inch width, 0.75 inch height, and sidewalls) using Teflon dielectric substrates and copper tape as the conductor. The coil configuration consisted of alternating (one-by-one) relatively thin and relatively thick transmission line elements with decoupling capacitors between elements to achieve nearest neighbor decoupling. In the example, the inner diameter of the coil was 10.0 inches and the length of each resonance element conductor strip was 5.5 inches. All experiments used a 7T magnet with a Siemens console and custom 50 ohm transmit/receive (T/R) switches. The transmit phase of each transmission line element was adjustable.

The foregoing dimensions are merely illustrative and are not meant to be limiting in any manner. It is contemplated that any diameter coil, conductor strip length, magnetic field, as well as any other parameters or dimensions, may be used, as desire.

Figure 24:
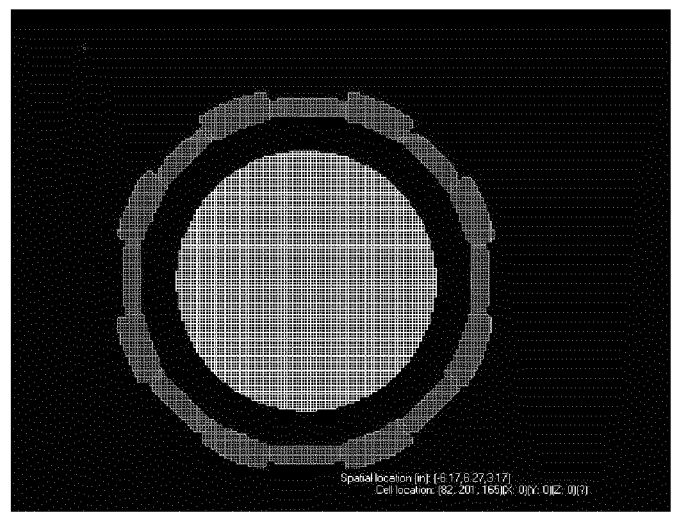
FIG. 24 is an illustrative simulated view of a sixteen channel staggered RF coil including a saline sphere phantom.
Figure 25:
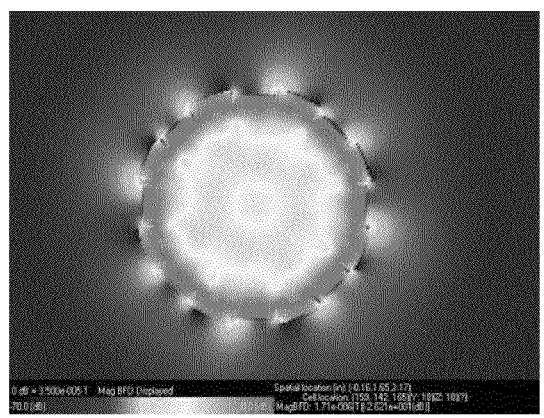
FIG. 25 is an illustrative simulated B1 field of the RF coil of FIG. 24 including the saline sphere phantom.

FIG. 24 is an illustrative simulated view of a sixteen channel staggered RF coil including a saline sphere phantom. As illustrated, the sixteen channel coil may include eight relatively thick transmission line elements and eight relatively thin transmission line elements arranged in a one-by-one alternating arrangement. When activated, the RF coil may produce a B1 field similar to the simulated B1 field of shown in FIG. 25.

Figure 26:
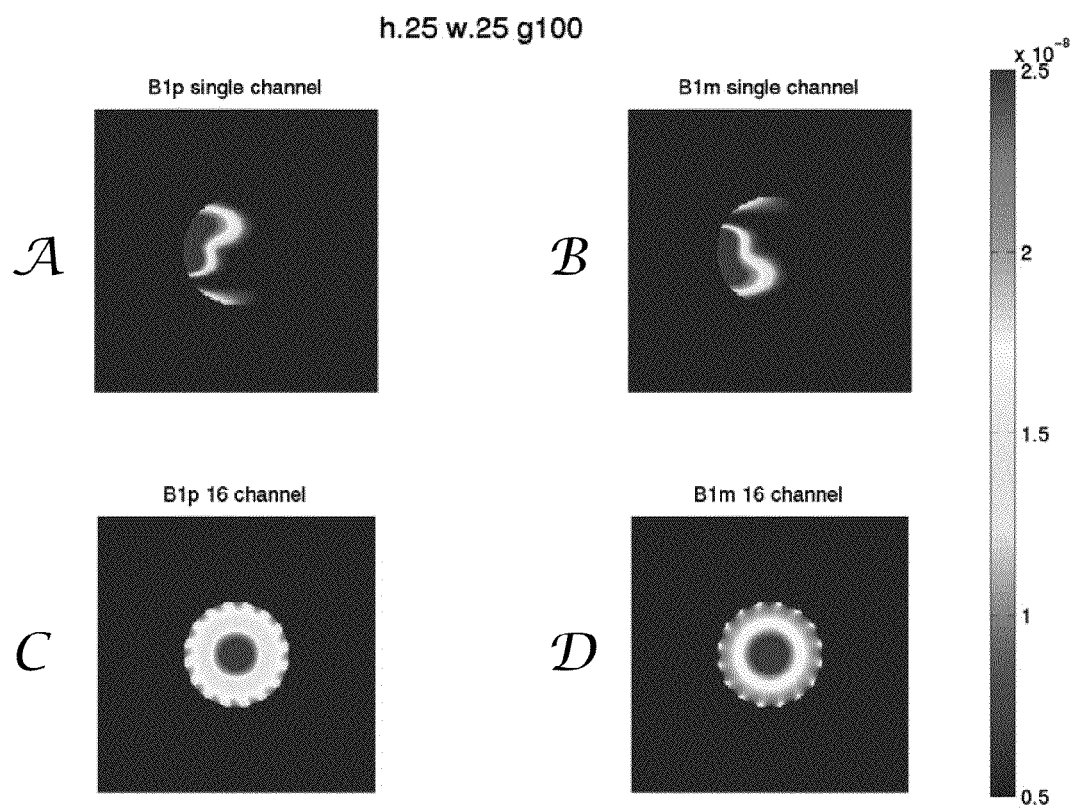
FIGS. 26-30 are illustrative simulated B1 fields of illustrative RF coils having uniform resonance elements.

FIGS. 26 A-D are illustrative simulated B1 fields of an illustrative RF coil having all the same transmission line elements. In the illustrative views, the RF coil may have a dielectric height of 0.25 inches (shown as h.25), a signal line width of 0.25 inches (shown as w.25), and a ground plane having sidewalls extending 100 percent of the height of the dielectric (shown as g100). FIG. 26A illustrates a B1p field (B1 plus which is transmit B1) of a single channel of the illustrative RF coil. FIG. 26B illustrates a B1m field (B1 minus which is receive B1) of a single channel of the illustrative RF coil. FIG. 26C illustrates a B1p field of an illustrative 16 channel RF coil. FIG. 26D illustrates a B1m field of an illustrative 16 channel coil.

Figure 27:
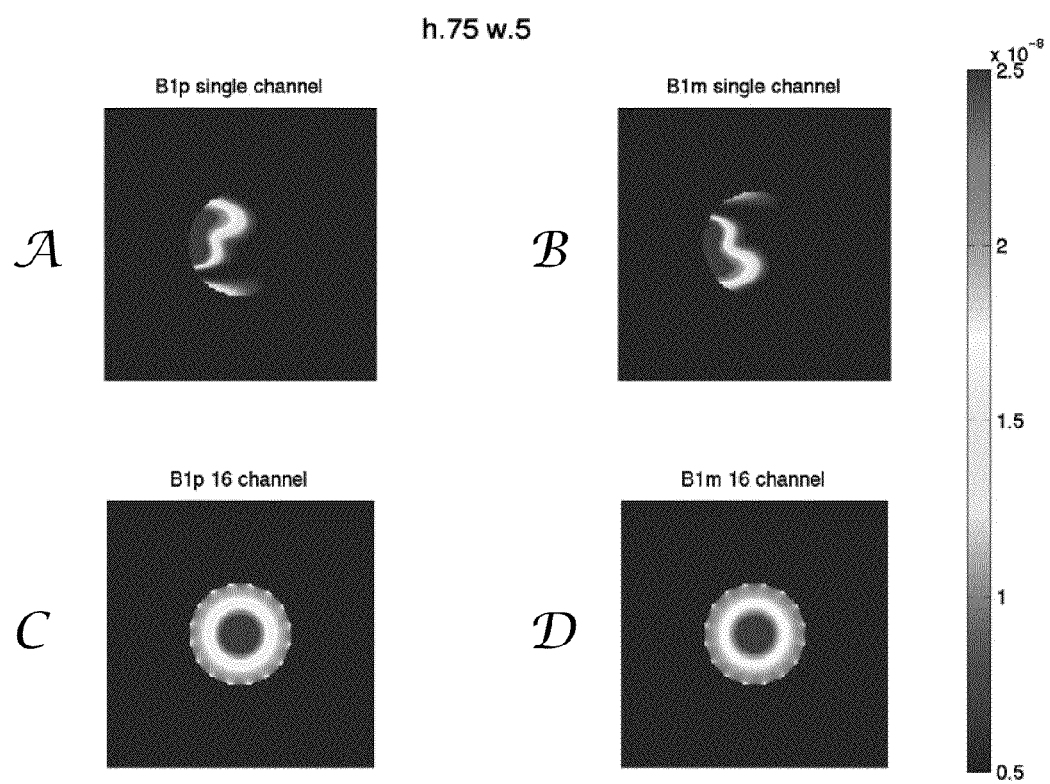

FIGS. 27 A-D are illustrative simulated B1 fields of an illustrative RF coil having all the same transmission line elements. In the illustrative views, the RF coil may have a dielectric height of 0.75 inches, a signal line width of 0.5 inches and a ground plane width of 100 inches. In the illustrative simulations, the ground plane does not include any sidewalls. FIG. 27A illustrates a B1p field of a single channel of the illustrative RF coil. FIG. 27B illustrates a B1m field of a single channel of the illustrative RF coil. FIG. 27C illustrates a B1p field of an illustrative 16 channel RF coil. FIG. 27D illustrates a B1m field of an illustrative 16 channel coil.

Figure 28:
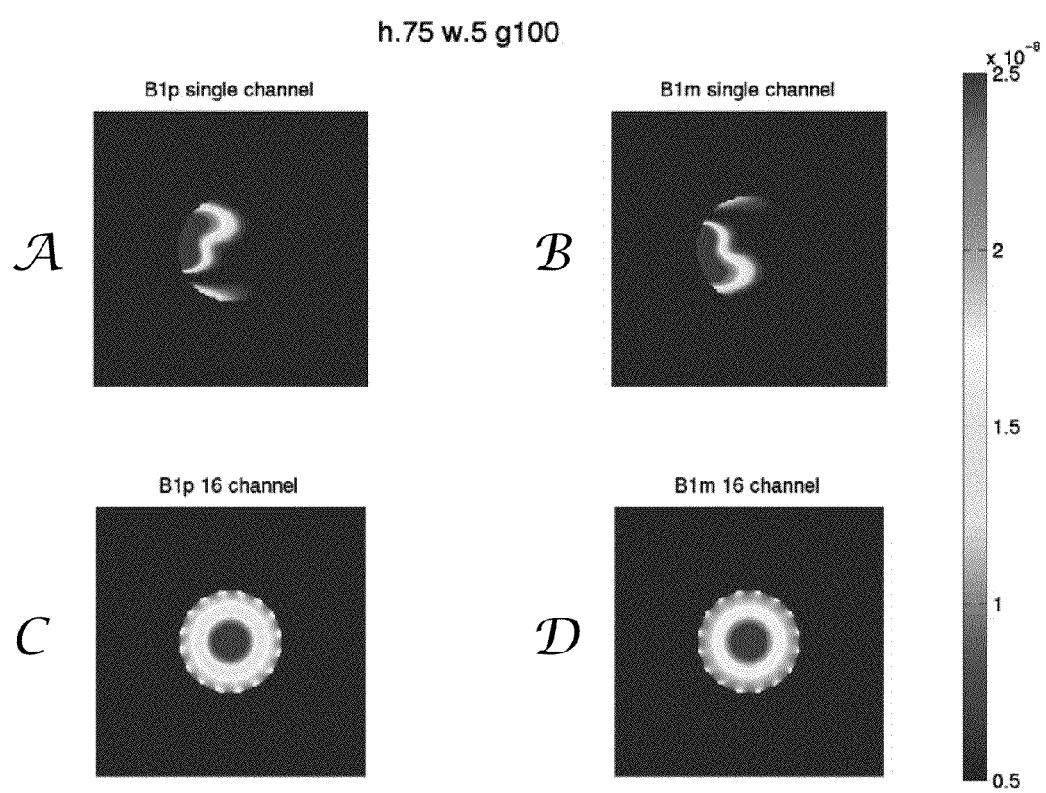

FIGS. 28 A-D are illustrative simulated B1 fields of an illustrative RF coil having all the same transmission line elements. In the illustrative views, the RF coil may have a dielectric height of 0.75 inches, a signal line width of 0.5 inches and a ground plane having sidewalls extending 100 percent of the height of the dielectric. FIG. 28A illustrates a B1p field of a single channel of the illustrative RF coil. FIG. 28B illustrates a B1m field of a single channel of the illustrative RF coil. FIG. 28C illustrates a B1p field of an illustrative 16 channel RF coil. FIG. 28D illustrates a B1m field of an illustrative 16 channel coil.

Figure 29:
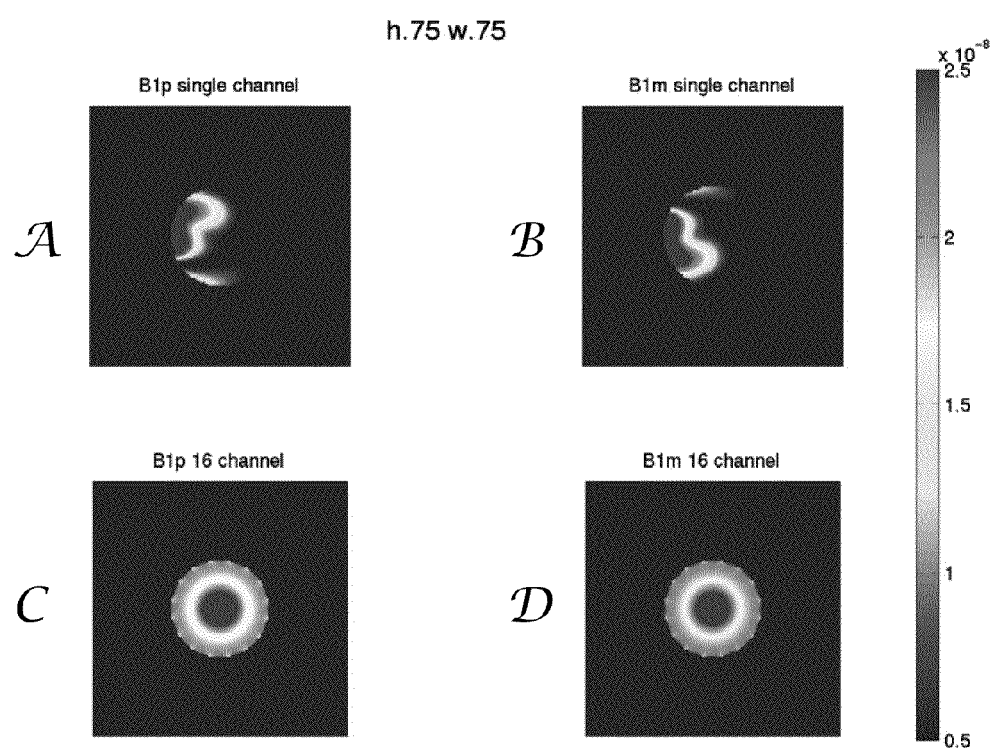

FIGS. 29 A-D are illustrative simulated B1 fields of an illustrative RF coil having all the same transmission line elements. In the illustrative views, the RF coil may have a dielectric height of 0.75 inches, a signal line width of 0.75. In the illustrative simulation, the ground plane does not include any sidewalls. FIG. 28A illustrates a B1p field of a single channel of the illustrative RF coil. FIG. 28B illustrates a B1m field of a single channel of the illustrative RF coil. FIG. 28C illustrates a B1p field of an illustrative 16 channel RF coil. FIG. 28D illustrates a B1m field of an illustrative 16 channel coil.

Figure 30:
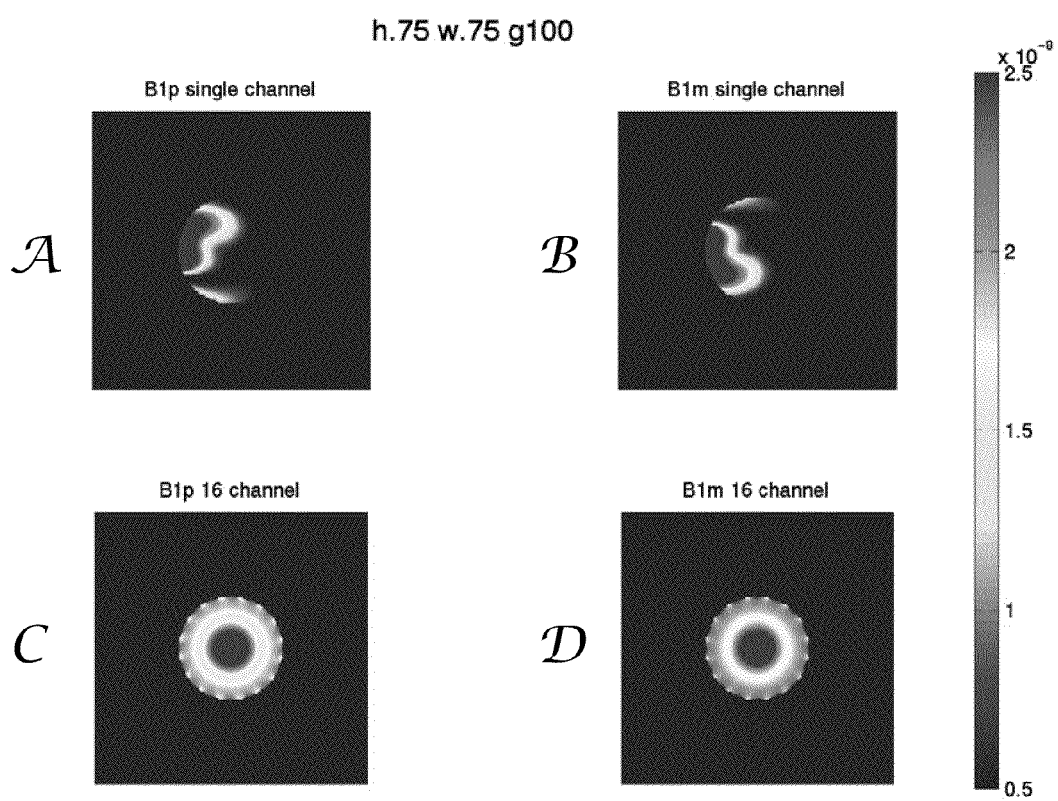

FIGS. 30 A-D are illustrative simulated B1 fields of an illustrative RF coil having all the same transmission line elements. In the illustrative views, the RF coil may have a dielectric height of 0.75 inches, a signal line width of 0.75 inches, and a ground plane including side walls extending up 100 percent of the height of the dielectric. FIG. 30A illustrates a B1p field of a single channel of the illustrative RF coil. FIG. 30B illustrates a B1m field of a single channel of the illustrative RF coil. FIG. 30C illustrates a B1p field of an illustrative 16 channel RF coil. FIG. 30D illustrates a B1m field of an illustrative 16 channel coil.

Figure 31:
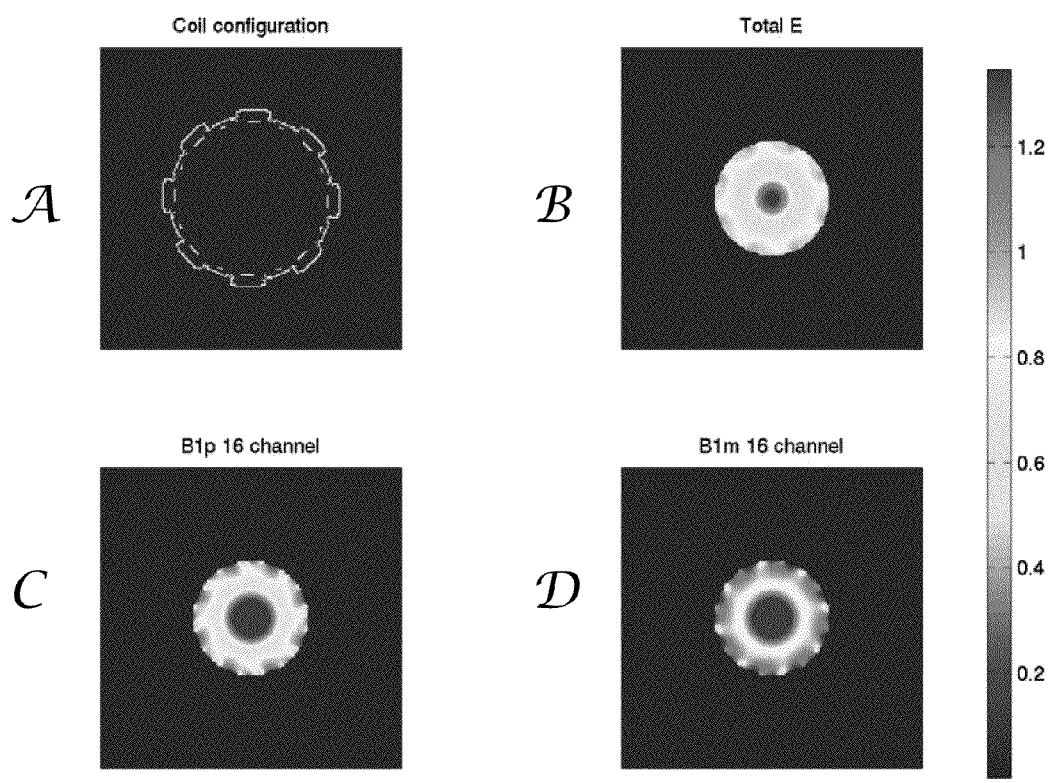
FIGS. 31-37 are illustrative simulated B (magnetic) field distributions and E (electric) field distributions of illustrative RF coils having two interleaving resonance elements of different physical dimensions and/or properties.

FIGS. 31A-D are illustrative simulated magnetic field distribution and electric field distribution of an illustrative RF coil having interleaving two transmission line elements having different physical dimensions and/or properties. FIG. 31A illustrates a configuration of the ground plane and signal line of the conductors. As can be seen, the illustrative RF coil is configured to have a one-by-one alternating arrangement of transmission line elements. At least some of the transmission line elements have sidewalls.

FIG. 31B illustrates an illustrative electric field of the RF coil. However, the E field is not on the same colorscale as the colorbar. FIG. 31C illustrates a B1p field of the illustrative 16 channel RF coil shown in FIG. 31A. FIG. 31D illustrates a B1m field of the illustrative 16 channel coil shown in FIG. 31A.

Figure 32:
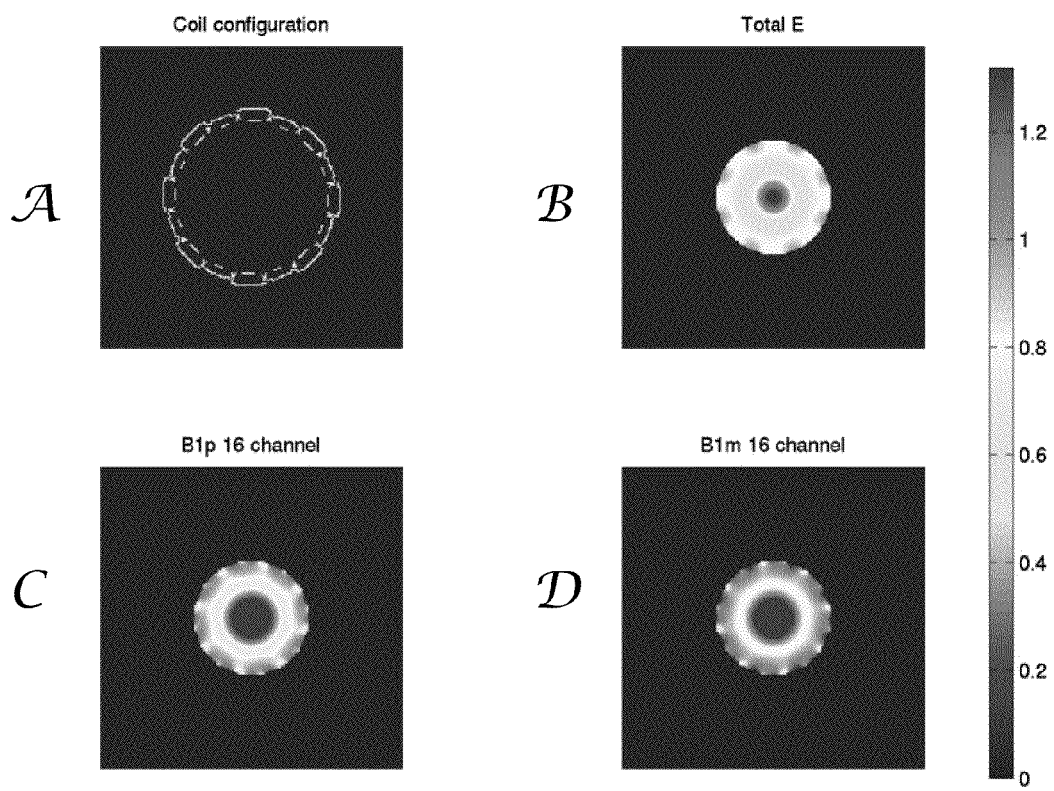

FIGS. 32 A-D are illustrative simulated magnetic field distribution and electric field distribution of an illustrative RF coil having interleaving two transmission line elements having different physical dimensions and/or properties. FIG. 32A illustrates a configuration of the ground plane and signal line of the conductors. As can be seen, the illustrative RF coil is configured to have a one-by-one alternating arrangement of transmission line elements. At least some of the transmission line elements have sidewalls.

FIG. 32B illustrates an illustrative electric field of the RF coil. However, the E field is not on the same colorscale as the colorbar. FIG. 32C illustrates a B1p field of the illustrative 16 channel RF coil shown in FIG. 32A. FIG. 32D illustrates a B1m field of the illustrative 16 channel coil shown in FIG. 32A.

Figure 33:
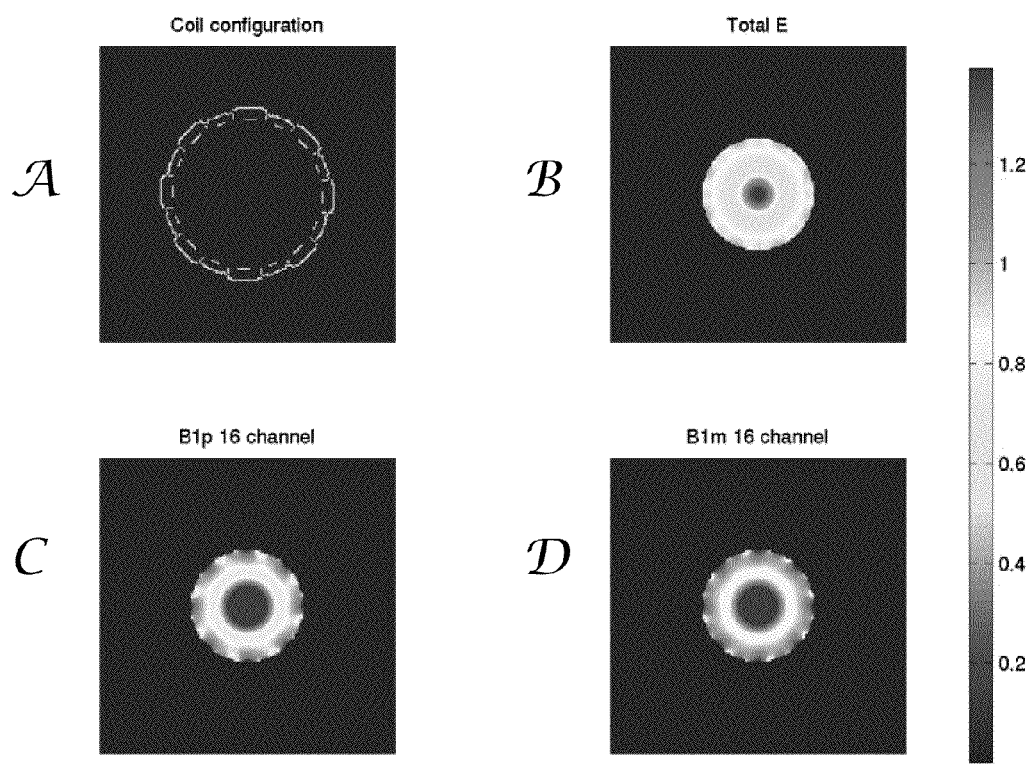

FIGS. 33 A-D are illustrative simulated magnetic field distribution and electric field distribution of an illustrative RF coil having interleaving two transmission line elements having different physical dimensions and/or properties. FIG. 33A illustrates a configuration of the ground plane and signal line of the conductors. As can be seen, the illustrative RF coil is configured to have a one-by-one alternating arrangement of transmission line elements. At least some of the transmission line elements may have sidewalls.

FIG. 33B illustrates an illustrative electric field of the RF coil. However, the E field is not on the same colorscale as the colorbar. FIG. 33C illustrates a B1p field of the illustrative 16 channel RF coil shown in FIG. 33A. FIG. 33D illustrates a B1m field of the illustrative 16 channel coil shown in FIG. 33A.

Figure 34:
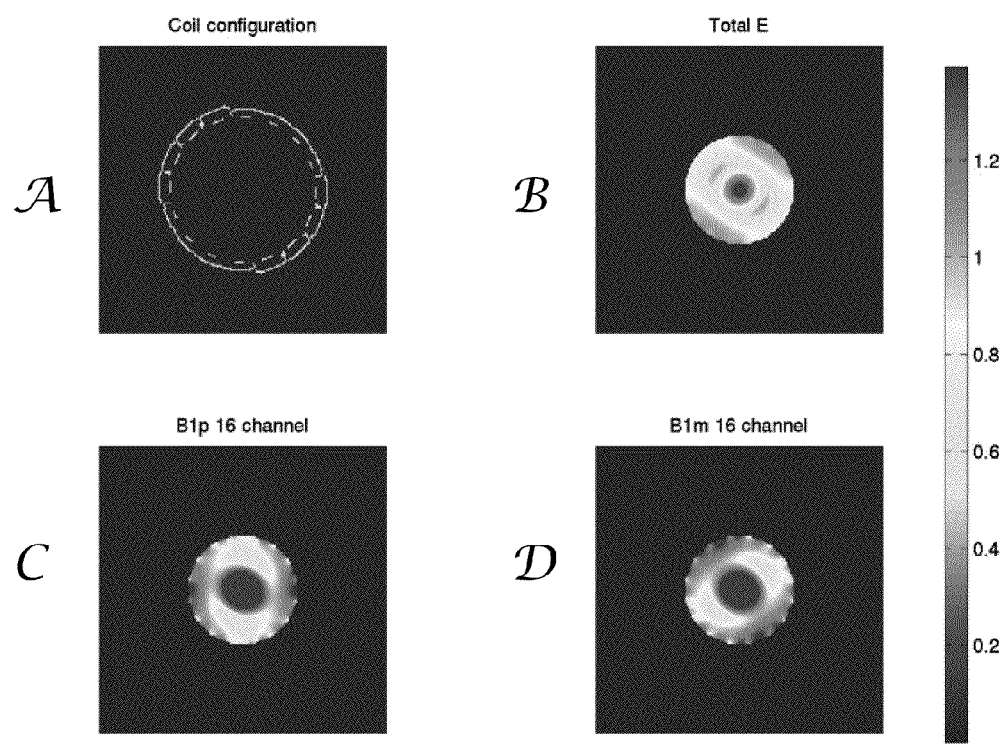

FIGS. 34 A-D are illustrative simulated magnetic field distribution and electric field distribution of an illustrative RF coil having interleaving two transmission line elements having different physical dimensions and/or properties. In the illustrative views, the RC coil may be grouped in sets of four. FIG. 34A illustrates a configuration of the ground plane and signal line of the conductors. As can be seen, the illustrative RF coil is configured to have a four-by-four alternating arrangement of transmission line elements. At least some of the relatively thicker transmission line elements have sidewalls. The relatively thinner transmission line elements may not include any sidewalls.

FIG. 34B illustrates an illustrative electric field of the RF coil. However, the E field is not on the same colorscale as the colorbar. FIG. 34C illustrates a B1p field of the illustrative 16 channel RF coil shown in FIG. 34A. FIG. 34D illustrates a B1m field of the illustrative 16 channel coil shown in FIG. 34A.

Figure 35:
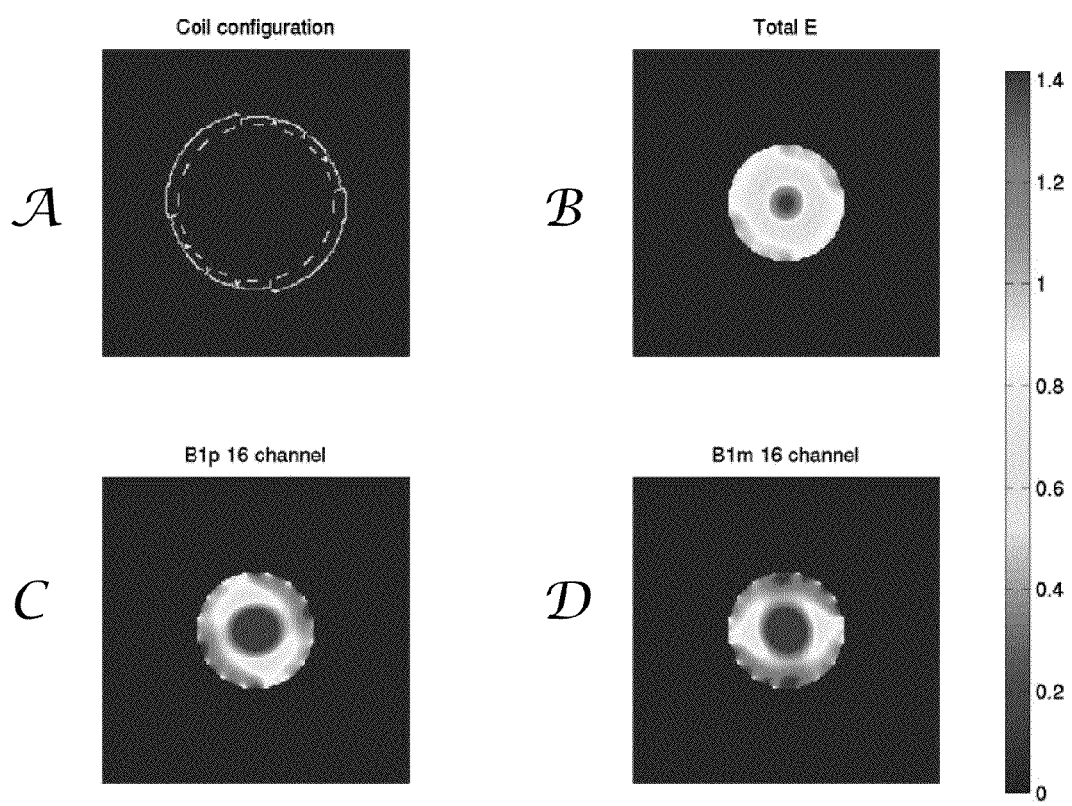

FIGS. 35 A-D are illustrative simulated magnetic field distribution and electric field distribution of an illustrative RF coil having interleaving two transmission line elements having different physical dimensions and/or properties. In the illustrative views, the RC coil may be grouped in sets of four. FIG. 35A illustrates a configuration of the ground plane and signal line of the conductors. As can be seen, the illustrative RF coil is configured to have a four-by-four alternating arrangement of transmission line elements. At least some of the relatively thinner transmission line elements have sidewalls. The relatively thicker transmission line elements may not include any sidewalls.

FIG. 35B illustrates an illustrative electric field of the RF coil. However, the E field is not on the same colorscale as the colorbar. FIG. 35C illustrates a B1p field of the illustrative 16 channel RF coil shown in FIG. 35A. FIG. 35D illustrates a B1m field of the illustrative 16 channel coil shown in FIG. 35A.

Figure 36:
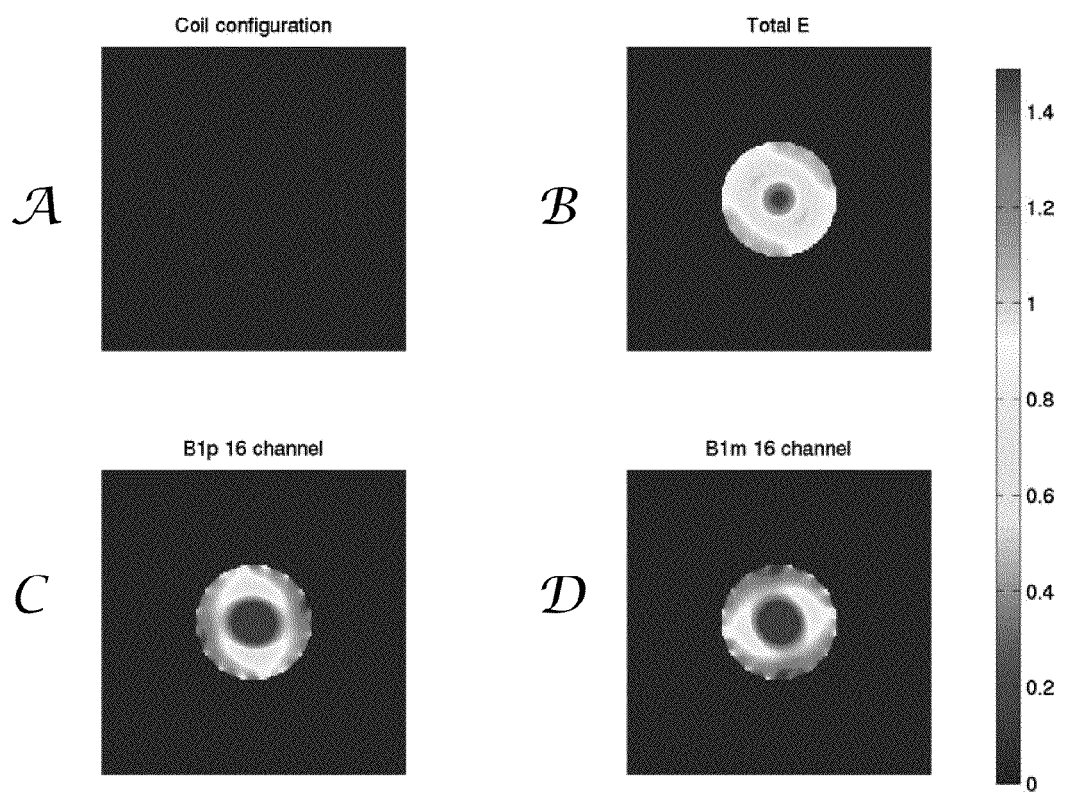

FIGS. 36 A-D are illustrative simulated magnetic field distribution and electric field distribution of an illustrative RF coil having interleaving two transmission line elements having different physical dimensions and/or properties. In the illustrative views, the RC coil may be grouped in sets of four. FIG. 36A illustrates a configuration of the ground plane and signal line of the conductors. As can be seen, the illustrative RF coil is configured to have a four-by-four alternating arrangement of transmission line elements. In the illustrative embodiment, none of the thicker or the thinner transmission line elements include ground planes having sidewalls.

FIG. 36B illustrates an illustrative electric field of the RF coil. However, the E field is not on the same colorscale as the colorbar. FIG. 36C illustrates a B1p field of the illustrative 16 channel RF coil shown in FIG. 36A. FIG. 36D illustrates a B1m field of the illustrative 16 channel coil shown in FIG. 36A.

Figure 37:
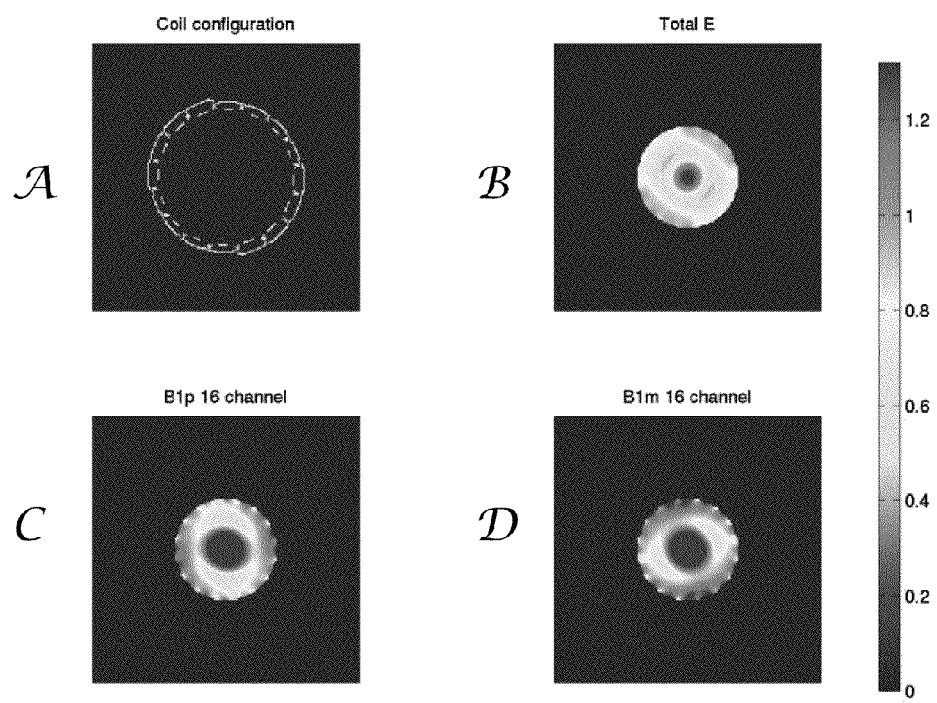

FIGS. 37 A-D are illustrative simulated magnetic field distribution and electric field distribution of an illustrative RF coil having interleaving two transmission line elements having different physical dimensions and/or properties. In the illustrative views, the RC coil may be grouped in sets of four. FIG. 37A illustrates a configuration of the ground plane and signal line of the conductors. As can be seen, the illustrative RF coil is configured to have a four-by-four alternating arrangement of transmission line elements. In the illustrative embodiment, all of the transmission lines have sidewalls.

FIG. 37B illustrates an illustrative electric field of the RF coil. However, the E field is not on the same colorscale as the colorbar. FIG. 37C illustrates a B1p field of the illustrative 16 channel RF coil shown in FIG. 37A. FIG. 37D illustrates a B1m field of the illustrative 16 channel coil shown in FIG. 37A.

FIGS. 38 A-O are illustrative simulated magnetic field distribution of an illustrative RF coil having two transmission line element types with different physical dimensions and properties. In the illustrative embodiment, the RF coil may be a ten inch eight channel coil having a B1p field.

FIG. 38 A-H show magnetic fields of coils that include uniform transmission line elements (all having identical designs or dimensions). However, the dimensions are varied among the different coils. For example, FIG. 38 A may have a height of 0.25 inches and a width of 0.25 inches; FIG. 38B may have a height of 0.25 inches, a width of 0.25 inches and a g of 100; FIG. 38C may having a height of 0.5 inches and a width of 0.5 inches; FIG. 38D may have a height of 0.5 inches; a width of 0.5 inches, and a g of 100; FIG. 38E may have a height of 0.75 inches and a width of 0.5 inches; FIG. 38F may have a height of 0.75 inches, a width of 0.75 inches, and a g of 100; FIG. 38G may have a height of 0.75 inches and a width of 0.75 inches; and FIG. 38H may have a height of 0.75 inches, a width of 0.75 inches and a g of 100.

FIGS. 38I-K show illustrative magnetic fields of RF coils having two sets of different dimension transmission line elements in a one-by-one alternating arrangement around the RF coil. FIG. 38 L-O show illustrative magnetic fields of RF coils having two sets of different dimensions transmission line elements in a four-by-four arrangement around the RF coil.

In at least some of the example, the simulations of a sixteen channel coil with dielectric substrate thicknesses of 0.5 inch, ground plane conductor widths of 0.5 inch and sidewalls produced a 10% increase in SNR in the periphery of the load compared to the same design without sidewalls. Additionally, in some cases, by increasing ground plane conductor widths to 0.75 inch and the dielectric substrate thickness to 0.75 inch, the SNR in the center of the load was calculated to be 10% greater than in the periphery.

FIGS. 39 and 40 are illustrative theoretical vector field plots of transmission line elements with regular ground planes and full ground planes. FIG. 39 illustrates theoretical vector field plots of transmission lines with ground planes having no sidewalls. FIG. 40 illustrates theoretical vector field plots of transmission lines with ground planes having sidewalls.

FIGS. 41A-C are theoretical FLASH images of a human head acquired with an illustrative RF coil. In the illustrative example, imaging performance of the RF coil was evaluated using FLASH (TR/TE: 22/5 ms), to acquire sagittal, coronal and axial slices. The resulting FLASH images (TR/TE: 22/5 ms) demonstrate good penetration and coverage. Some signal intensity variation may be present, but much of that may be due to sub-optimal coarse adjustment of the transmit phases. The noise correlation matrix may be uniformly low, indicating that the channels may be adequately isolated from one another, due in part to the ground sidewalls on each element.

Example Conclusions

The illustrative RF coil demonstrated efficient coupling to the central and periphery of the head by the use of alternating TEM elements designed for shallow and deep penetration. These independently driven elements were sufficiently decoupled to facilitate (transmit) parallel imaging as well. Both simulations and images acquired demonstrate good penetration and coverage with a uniformly low noise correlation matrix.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respect, only illustrative. Changes may be made in details, particularly in matters of shape, size, and arrangement of parts without exceeding the scope of the invention. The invention's scope is, of course, defined in the language in which the appended claims are expressed.

The invention claimed is:

1. A radio frequency (RF) coil comprising:
a plurality of transmission line elements, each of the plurality of transmission line elements including a ground plane conductor and a signal line conductor separated a distance by a dielectric, wherein the distance separating the ground plane conductor and the signal line conductor in a first transmission line element is different than the distance separating the ground plane conductor and the signal line conductor in a second transmission line element.

2. A radio frequency (RF) coil comprising:
a plurality of transmission line elements, each of the plurality of transmission line elements including a ground plane conductor and a signal line conductor separated by a dielectric, wherein the ground plane conductor in a first transmission line element has one or more sidewalls disposed a first distance about a side edge of the dielectric and the ground plane conductor of a second transmission line element has one or more sidewalls disposed a second distance about a side edge of the dielectric, wherein the second distance is different than the first distance.

3. The RF coil of claim 2 wherein the second distance is zero inches.

* * * * *

UNITED STATES PATENT AND TRADEMARK OFFICE
CERTIFICATE OF CORRECTION

PATENT NO. : 8,193,809 B2  Page 1 of 1
APPLICATION NO. : 12/151053
DATED : June 5, 2012
INVENTOR(S) : Can E. Akgun et al.

It is certified that error appears in the above-identified patent and that said Letters Patent is hereby corrected as shown below:

Column 1, line 13, under the heading FEDERAL SPONSORSHIP, delete the following:

"This application was made with government support under Grant Numbers NIH-F01 EB000895, NIH-R01 EB00331, NIH-P41, RR008079, MIND Institute, W.M. Keck Foundation and BTRR-P41 RR008079. The government may have certain rights to the invention"

and add the following:

--This invention was made with government support under EB000895, EB00331, and RR008079 awarded by the National Institutes of Health. The government has certain rights in the invention.--

Signed and Sealed this
Eleventh Day of September, 2012

David J. Kappos
*Director of the United States Patent and Trademark Office*